US008764528B2

(12) United States Patent
Tresh et al.

(10) Patent No.: US 8,764,528 B2
(45) Date of Patent: Jul. 1, 2014

(54) SYSTEMS AND METHODS FOR CLOSED LOOP HEAT CONTAINMENT WITH COLD AISLE ISOLATION FOR DATA CENTER COOLING

(75) Inventors: Michael Tresh, Haverhill, MA (US); Brian Jackson, Waltham, MA (US); Edward Bednarcik, East Greenwich, RI (US); John Prunier, Spencer, MA (US); Martin Olsen, East Greenwich, RI (US); Mark Germagian, North Hubbardston, MA (US)

(73) Assignee: Wright Line, LLC, Worcester, MA (US)

( * ) Notice: Subject to any disclaimer, the term of this patent is extended or adjusted under 35 U.S.C. 154(b) by 835 days.

(21) Appl. No.: 12/432,154

(22) Filed: Apr. 29, 2009
(Under 37 CFR 1.47)

(65) Prior Publication Data
US 2010/0216388 A1 Aug. 26, 2010

Related U.S. Application Data

(63) Continuation-in-part of application No. 11/412,430, filed on Apr. 27, 2006, now Pat. No. 7,604,535.

(60) Provisional application No. 61/048,649, filed on Apr. 29, 2008, provisional application No. 61/142,432, filed on Jan. 5, 2009.

(51) Int. Cl.
*F24F 1/00* (2011.01)
*H05K 7/20* (2006.01)

(52) U.S. Cl.
USPC .......................................... 454/184; 361/691

(58) Field of Classification Search
USPC ......................................................... 454/184
See application file for complete search history.

(56) References Cited

U.S. PATENT DOCUMENTS

| 3,903,404 | A | 9/1975 | Beall et al. |
| 4,158,875 | A | 6/1979 | Tajima et al. |
| 4,774,631 | A | 9/1988 | Okuyama et al. |
| 5,173,819 | A | 12/1992 | Takahashi et al. |
| 5,544,012 | A | 8/1996 | Koike |
| 5,671,805 | A | 9/1997 | Stahl et al. |

(Continued)

*Primary Examiner* — Kang Hu
*Assistant Examiner* — Phillip E Decker
(74) *Attorney, Agent, or Firm* — Dingman, McInnes & McLane, LLP

(57) ABSTRACT

The invention combines systems and methods for heat containment and cold air isolation for managing airflow and temperature in data centers. The data center contains at least two rows of cabinets containing heat-generating equipment and arranged to form a cold aisle and a hot aisle. The data center system includes panels or doors at both ends of the cold aisle and an optional cover over the cold aisle to inhibit cooled air supplied by an air conditioning system from exiting the cold aisle and inhibit air warmed by the heat-generating components from entering the cold aisle. A chimney coupled to the top, rear, or top and rear of the cabinets is configured to exhaust the warmed air into a region above the rows of cabinets. The chimneys may be ducted to a plenum or suspended ceiling or to the intake of the air conditioning system. Baffles and/or fans may be included in the chimneys, ducts, and/or plenums to control the air pressure. The invention may also include one or more data center air conditioning units, and each air conditioning unit may be configured to service one or more rows of cabinets. Alternatively, or in addition, cool air may be supplied by the building's air conditioning system.

18 Claims, 26 Drawing Sheets

(56) References Cited

U.S. PATENT DOCUMENTS

| | | | |
|---|---|---|---|
| 5,718,628 A | 2/1998 | Nakazato et al. | |
| 5,934,368 A | 8/1999 | Tanaka et al. | |
| 6,052,282 A | 4/2000 | Sugiyama et al. | |
| 6,094,346 A * | 7/2000 | Schweers et al. | 361/695 |
| 6,186,890 B1 | 2/2001 | French et al. | |
| 6,305,180 B1 | 10/2001 | Miller et al. | |
| 6,400,567 B1 | 6/2002 | McKeen et al. | |
| 6,412,292 B2 * | 7/2002 | Spinazzola et al. | 62/89 |
| 6,494,050 B2 * | 12/2002 | Spinazzola et al. | 62/89 |
| 6,557,357 B2 * | 5/2003 | Spinazzola et al. | 62/89 |
| 6,574,970 B2 * | 6/2003 | Spinazzola et al. | 62/89 |
| 6,672,955 B2 * | 1/2004 | Charron | 454/184 |
| 6,722,151 B2 * | 4/2004 | Spinazzola et al. | 62/259.2 |
| 6,745,579 B2 * | 6/2004 | Spinazzola et al. | 62/89 |
| 6,859,366 B2 * | 2/2005 | Fink | 361/690 |
| 7,033,267 B2 | 4/2006 | Rasmussen | |
| 7,112,131 B2 | 9/2006 | Rasmussen et al. | |
| 7,154,748 B2 | 12/2006 | Yamada | |
| 7,238,104 B1 | 7/2007 | Greenslade et al. | |
| 7,283,358 B2 | 10/2007 | Campbell et al. | |
| 7,365,973 B2 * | 4/2008 | Rasmussen et al. | 454/184 |
| 7,430,118 B1 | 9/2008 | Noteboom et al. | |
| 7,542,287 B2 * | 6/2009 | Lewis et al. | 361/695 |
| 7,752,858 B2 * | 7/2010 | Johnson et al. | 62/186 |
| 7,841,199 B2 * | 11/2010 | VanGilder et al. | 62/259.2 |
| 7,992,402 B2 * | 8/2011 | VanGilder et al. | 62/259.2 |
| 8,107,238 B2 * | 1/2012 | Krietzman et al. | 454/184 |
| 2001/0029163 A1 * | 10/2001 | Spinazzola et al. | 454/184 |
| 2002/0108386 A1 * | 8/2002 | Spinazzola et al. | 62/259.2 |
| 2003/0050003 A1 * | 3/2003 | Charron | 454/184 |
| 2004/0184232 A1 * | 9/2004 | Fink | 361/690 |
| 2005/0170770 A1 * | 8/2005 | Johnson et al. | 454/184 |
| 2006/0260338 A1 * | 11/2006 | VanGilder et al. | 62/259.2 |
| 2007/0064389 A1 * | 3/2007 | Lewis et al. | 361/690 |
| 2007/0254583 A1 | 11/2007 | Germagian et al. | |
| 2009/0107652 A1 * | 4/2009 | VanGilder et al. | 165/80.2 |
| 2009/0277605 A1 * | 11/2009 | VanGilder et al. | 165/67 |
| 2009/0308579 A1 * | 12/2009 | Johnson et al. | 165/104.34 |
| 2010/0252233 A1 * | 10/2010 | Absalom | 165/57 |
| 2011/0143644 A1 * | 6/2011 | McMahan et al. | 454/184 |

* cited by examiner

SYSTEMS AND METHODS FOR CLOSED LOOP HEAT CONTAINMENT WITH COLD AISLE ISOLATION FOR DATA CENTER COOLING

CROSS-REFERENCE TO RELATED APPLICATIONS

This application is a continuation-in-part of, and claims priority from, U.S. patent application Ser. No. 11/412,430 entitled "Assembly for Extracting Heat from a Housing for Electronic Equipment," filed Apr. 27, 2006, the entire content of which is expressly incorporated by reference herein, and further claims priority to U.S. Provisional Patent Application Ser. Nos. 61/048,649, entitled "Systems and Methods for Closed Loop Heat Containment with Cold Aisle Isolation for Data Center Cooling," filed on Apr. 29, 2008, and 61/142,432, entitled, "Systems and Methods for Closed Loop Heat Containment with Cold Aisle Isolation for Data Center Cooling," filed on Jan. 5, 2009, the entire contents of which are expressly incorporated by reference herein.

FIELD OF THE INVENTION

This invention relates to the field of data center airflow and temperature management, combining elements of both heat containment and cold air isolation systems, and to a housing for electronic equipment with improved heat-dissipation characteristics.

BACKGROUND OF THE INVENTION

Electronic equipment is often located within a housing, such as an equipment rack used to hold computer servers and the like in assemblies that are located within the rack. The electronic equipment generates substantial heat that must be dissipated. Cool air typically passes through the housings to help dissipate heat. In many cases, fans located in the front door and/or back door and/or within the rack and/or in the top of the rack are used to circulate the cold air and expel the warmed air.

One solution proposes a front or back rack panel that is several inches thick, and carries ducting and fans to route air through the rack. Cool air enters the bottom of the front, and exits the top of the back. However, such thickened panels increase the depth of the racks, which inherently limits the number of racks that can be fit into a data center.

As with individual equipment racks, there are heat dissipation and energy consumption issues associate with data centers. Resource demands and constraints, including those related to power, represent a critical concern in the United States today. The increasing demand, and strain, placed upon electrical grids across the United States by data centers of all sizes is a material contributor to this issue.

The United States Environmental Protection Agency (EPA) addressed this issue in August 2007 and submitted a report to the United States Congress as part of public law to help define a vision for achieving energy efficiencies in data centers. The EPA predicts that by 2011, 2% of the United State's entire energy supply will be consumed by data centers.

Currently, data center managers are focused on the delivery of service and dependability. There has been little incentive, however, for data center managers to optimize the energy efficiency of their data center. In addition, the industry has not set any proper benchmarks for attainable energy efficiency targets, which further complicates the situation. Data center managers are primarily concerned about capital costs related to their data center's capacity and reliability. In most cases the energy costs are either hidden among other operating costs or simply absorbed as a cost of doing business. A study by the company IDC Global shows that for every $1.00 US of new server spend in 2005, $0.48 US was spent on power and cooling. This is a sharp increase from the year 2000, when the ratio was $0.21 US per $1.00 US of server spend. This ratio is anticipated to increase even further. It is expected, then, that the immediate demand to create more efficient data centers will be at the forefront of most company's cost saving initiatives.

Prior art legacy data centers typically have the following characteristics:

(1) An open air system that delivers cold air at approximately 55 degrees Fahrenheit (approximately 13 degrees Celsius) via overhead ducting, flooded room supply air, or a raised floor plenum;

(2) Perforated tiles (in a raised floor environment) that are used to channel the cold air from beneath the raised floor plenum into the data center;

(3) Computer racks, server enclosures and free-standing equipment orientated 180 degrees from alternate rows to create hot and cold aisles, which is an accepted best practice. Historically, however, information technology (IT) architecture has been the driving force in deciding the location of the racks and other equipment, leading to a disorganized and inefficient approach to air distribution;

(4) A minimum separation of 4 feet (approximately 1.22 meters) between cold aisles and 3 feet (approximately 0.91 meters) between hot aisles, based on recommendations from the American National Standards Institute (ANSI/TIA/EIA-942 April 2005), National Fire Protection Association (NFPA), National Electric Code (NEC), and local Authority Having Jurisdiction (AHJ);

(5) Dedicated precision air conditioning units located at the nearest perimeter wall and generally in close proximity to IT racks. However, optimal placement of the computer room air conditioner (CRAC) for free air movement is biased by structural columns, and often requires service clearances or other infrastructure accommodations;

(6) Traditional air conditioning systems are "turned on" on day one, and remain at full capability for cooling, even if only a small percentage of the design load is required; and (7) Existing air conditioning systems have limitations and are sensitive to the location of heat loads in and around the data center, and therefore are not resilient to changing configurations and requirements.

In practice, the airflow in the legacy data center is very unpredictable, and has numerous inefficiencies, which are proliferated as power densities increase. Problems encountered in a data center include: bypass airflow, recirculation, hot and cold air remixing, air stratification, air stagnation, and uncomfortable data center ambient room temperature.

Bypass Airflow

Bypass airflow is defined as conditioned air that does not reach computer equipment. The most common form of bypass airflow occurs when air supplied from the precision air conditioning units is returned directly back to the air conditioner's intake. Examples of this form of bypass airflow may include leakage areas such as air penetrating through cable cut-outs, holes under cabinets, or misplaced perforated tiles that blow air directly back to the air conditioner's intake. Other examples of bypass airflow include air that escapes through holes in the computer room perimeter walls and non-sealed doors.

A recent study completed by engineers from UpSite Technologies, Inc.™ and Uptime Institute, Inc.® concluded that in conventional legacy data centers only 40% of the air delivered from precision air conditioning units makes its way to cool the existing information technology (IT) equipment. This amounts to a tremendous waste in energy, as well as an excessive and unnecessary operational expense.

Recirculation

Recirculation occurs when the hot air exhausted from a computing device, typically mounted in a rack or cabinet, is fed back into its own intake or the intake of a different computing device. Recirculation principally occurs in servers located at the highest points of a high-density rack enclosure. Recirculation can result in potential overheating and damage to computing equipment, which may cause disruption to mission-critical services in the data center.

Hot and Cold Air Remixing and Air Stratification

Air stratification in a data center is defined as the layering effect of temperature gradients from the bottom to the top of the rack or cabinet enclosure.

In general, in a raised floor environment, air is delivered at approximately 55 degrees Fahrenheit (approximately 13 degrees Celsius) from under the raised floor through perforated tiles. The temperature of the air as it penetrates the perforated tile remains the same as the supply temperature. As the air moves vertically up the rack however, the air temperatures gradually increase. In high-density rack enclosures it is not uncommon for temperatures to exceed 90 degrees Fahrenheit (approximately 32 degrees Celsius) at the server intakes mounted at the highest point of the rack enclosure. The recommended temperature range however, for server intakes, as stated by ASHRAE Technical Committee 9.9 Mission Critical Facilities, is between 68 and 77 degrees Fahrenheit (approximately 20 to 25 degrees Celsius).

Thus, in a legacy data center design, the computer room is overcooled by sending extremely cold air under the raised floor, simply because there is a lack of temperature control as the air moves upward through the rack or cabinet enclosure.

In addition, because the hot air and the cold air are not isolated, and tend to mix, dedicated air conditioning units are typically located close to the rack enclosures, which may not be the most efficient or economical placement. In some situations, the most efficient or economical solution may be to use the building's air conditioning system, rather than having air conditioning units that are dedicated to the data center, or a combination of dedicated air conditioning units and the building's air conditioning system.

Air Stagnation

Large data centers typically have areas where the air does not flow naturally. As a result, the available cooling cannot be delivered to the computing equipment. In practice, data centers may take measures to generate air flow in these areas by utilizing air scoops, directional vanes, oscillating floor fans, and active fan-based floor tiles.

Uncomfortable Data Center Ambient Room Temperature

Data center ambient room temperature is not conditioned to comfortable working conditions. The ambient air temperature in a data center is typically determined by inefficiencies between providing cool air and removing heated air.

There is a need in the art, then, for improved methods for heat dissipation in equipment racks, and improved systems and methods for heat containment and cold air isolation in data centers. In particular, there is a need to remedy the typical problems encountered in a data center, including bypass airflow, recirculation, hot and cold air remixing, air stagnation, air stratification, and uncomfortable data center ambient room temperature. Improved systems and method are needed to eliminate wasted conditioned air and increase air conditioner efficiency.

SUMMARY OF THE INVENTION

It is therefore an object of this invention to provide a rack cooling system that maintains the depth of the rack to a minimum, thus maximizing data center rack capacity.

This invention features an assembly for extracting heat from a housing for electronic equipment, the housing having a front, a back, two sides and a top, the assembly comprising a back for the housing that defines an open area proximate the top, and an air passageway in fluid communication with the open area in the back, to conduct heated air exiting the housing through the open area away from the housing. The open area preferably extends across at least the majority of the width of the back, and may extend across substantially all of the width of the back. The open area may also encompass a portion of the top adjacent to the back. The open area could alternatively be located in the top proximate the back. The front of the housing may be perforated. The housing may comprise an electronic equipment rack.

The assembly may further comprise an air-moving device in fluid communication with the air passageway. The air-moving device may be located in the air passageway, or located at the intersection of the back of the housing and the air passageway.

The air passageway may be directly coupled to the back of the housing. The air passageway may extend out from the back of the housing. The air passageway may further extend up after extending out from the back of the housing. In one particular embodiment, the air passageway may extend out at an angle of no more than about ninety degrees from the back of the housing; in a more particular embodiment, the air passageway may extend out at an angle of about forty-five degrees.

The air passageway may comprise a duct. The duct may be flexible or not. The assembly may comprise at least two ducts which are essentially parallel to one another. The assembly may further comprise an air-moving device in each duct. The air passageway may be located a sufficient height off the floor so as to meet relevant height safety regulations. There may be essentially no openings in the housing top, so that the entire top area is available for routing of additional equipment.

The invention also features a data center arrangement comprising at least two electronic equipment racks, each rack having a front, a back, two sides and a top, the arrangement comprising two electronic equipment racks spaced apart by about thirty-six inches, the back of each rack being essentially solid except for an open area proximate the top, and at least one air passageway in fluid communication with the open area in the back of each rack, to conduct heated air exiting the rack through the open area away from the rack. The data center may further comprise an enclosed ceiling. The air passageways may be in fluid communication with the enclosed ceiling. The data center may further comprise an air-cooling apparatus in fluid communication with the enclosed ceiling. The data center may further comprise means for providing cooled air from the air-cooling apparatus to the front of the racks.

The invention also provides improved systems and methods for heat containment and cold air isolation in data centers. The combination of elements in the invention, including the use of chimneys, ducts, plenums, baffles, and fans, provides a unique and effective solution to the typical problems encountered in a data center, including bypass airflow, recirculation, hot and cold air remixing and air stratification, air stagnation, and uncomfortable data center ambient room temperature. The invention also reduces or eliminates wasted conditioned air and increases air conditioner efficiency. Advantages of the invention include:

(1) Preventing the mixing of the hot air and cold air in a data center through ducting, plenums, and physical separation;

(2) Returning higher temperature air directly to the air conditioner to allow the air conditioner to operate more efficiently, as well as allowing the same cooling device to remove more heat, as typically measured in BTUs (British Thermal Units) per unit, thus increasing the cooling capacity of the air conditioner;

(3) Providing an opportunity to use dedicated data center air conditioning units, the building air conditioning system, or a combination of both to make the most efficient use of the air conditioning equipment;

(4) Providing an opportunity to run the data center (outside of the isolated cold isle) at near standard office temperatures, thus reducing significantly the amount of cold air that needs to be generated and treated and the energy required to power the air conditioners, and providing a more comfortable working environment;

(5) Allowing for both scalability of solution as well as integration into many different types of data center rooms and environments varying in both size as well as density of equipment;

(6) Allowing the data center to use air-side economizers to exchange heated air with cooler outside air through the aggregation of the hot air to a plenum, thus reducing the cooling system power consumption; and (7) Permitting non-standard floor rack layouts, where the cabinets and enclosures are not arranged in a hot/cold aisle arrangement, which is often required to support the IT function or network demands, thus increasing performance by containing the hot and cool air The invention combines server cabinets or enclosures with a number of elements, including chimneys that attach to the top, rear, or top and rear of the cabinets or enclosures to facilitate the removal of the hot air; top and air seal kits; solid rear and/or front doors or panels on the enclosures; perforated front doors or panels on the enclosures; and special divider baffles, such as doors and panels, for heat containment and cold air isolation. The chimneys, ducts and/or plenums may also include fans and/or baffles, which may also be redundant. Ducts attached to the tops of the chimneys return hot air from the cabinets or enclosures to one of the following:

(1) A below-ceiling duct that returns the hot air to a computer room air conditioner and/or the building's air conditioning system;

(2) A vertical duct that exhausts air high into a room, such that a computer room air conditioner and/or building air conditioning system will intake that exhausted hot air.

(3) A pressurized ceiling plenum or suspended ceiling that returns the hot air to a computer room air conditioner and/or the building's air conditioning system;

The invention may also include air conditioning units to supply cool air to the cabinets. The air conditioning units may be redundant. In other embodiments the building's air conditioning system may be used instead of, or in combination with, dedicated data center precision air conditioning units. In addition, the ducts to and from the air conditioning units may be configured to allow any one air conditioning unit to selectively service one or more rows of cabinets through the use of baffles and/or fans. The baffles and/or fans may also be used to control the air pressure within the chimneys, ducts, and/or plenums. The invention thus effectively contains the hot air exhausted by the computer equipment and IT hardware located in the cabinets or enclosures. In addition, by adding baffles, such as doors or panels, that join the rows of enclosures on each end, and face each other across a row (typically called the cold aisle), and by optionally attaching a roof or cover comprised typically of clear material such as, but not exclusively, Plexiglas®, the invention isolates the cold air that is piped from the air conditioning units typically under floor, in-row, or overhead, into the cold aisle. The invention thus combines elements to provide both heat containment and cold air isolation.

The invention further contemplates instrumenting various locations and equipment in the data center to monitor and control temperature, air pressure, power consumption, efficiency, and overall availability.

These and other aspects of the invention will become apparent from the following description. In the description, reference is made to the accompanying drawings, which form a part hereof, and in which there are shown preferred embodiments of the invention. Such embodiments do not necessarily represent the full scope of the invention, and reference is therefore made to the claims for understanding the true scope of the invention.

In preferred embodiments, the invention provides a system for use in a data center having a source of cool air, the system comprising a plurality of cabinets, each cabinet comprising a generally rectangular vertical front face, two generally rectangular vertical side faces coupled to the front face, a generally rectangular top face coupled to the side faces and to the front face, a generally rectangular back face coupled to the side faces, and an interior that is adapted to house one or more heat-generating components, each of the cabinets adapted to intake the cool air, wherein the plurality of cabinets are arranged in a first row and a second row horizontally displaced from each other such that the front faces of the cabinets in the first row are facing the front faces of the cabinets in the second row to define a cold aisle between the front faces; a first baffle proximate the front face of a first cabinet in the first row and the front face of a first cabinet in the second row, the first baffle being configured to inhibit horizontal airflow into and out of the cold aisle; a second baffle proximate the front face of a last cabinet in the first row and the front face of a last cabinet in the second row, the second baffle being configured to inhibit horizontal airflow into and out of the cold aisle; and at least one chimney in communication with at least one cabinet, for conducting air warmed by the heat-generating components to a location above the cabinets.

In an aspect, the chimney defines an air passageway that is in fluid communication with the interior of the cabinet, the air passageway comprising an inlet for taking in air leaving the cabinet and an outlet for conducting the air out of the air passageway to the location above the cabinets.

In another aspect, the top face of each cabinet defines a first opening leading to the rack interior, with the first opening located at the back of the top face, proximate the back face; the back face of each cabinet defines a second opening leading to the cabinet interior, with the second opening located at the top of the back face, proximate the top face; the first opening is contiguous with the second opening; and the chimney defines an air passageway that encompasses and is in fluid communication with the first and second openings, with the air passageway comprising an inlet for taking in air leaving the cabinet, and an outlet for conducting the air out of the air passageway to the location above the cabinets.

In an aspect, the chimney includes a fan. In another aspect, the chimney is in communication with the top face of the cabinet. In a further aspect, the chimney is in communication with the rear face of the cabinet. In yet another aspect, the chimney is in communication with the top and rear faces of the cabinet.

In an aspect, one or more air conditioning units are configured to source the cool air to the data center. In another aspect, the cool air is delivered to the cold aisle through a plurality of perforations in a floor of the data center. In a further aspect, the cool air is delivered to the cold aisle through the bottoms of the cabinets. In another aspect, the cool air is delivered directly into the cold aisle through one or more ducts. In yet another aspect, at least one duct is in communication with the chimney, to conduct air warmed by the heat-generating components to a suspended ceiling.

In an aspect, the duct comprises a fan or baffle. In another aspect, at least one duct is in communication with the chimney, to conduct air warmed by the heat-generating components directly to an intake of at least one of the air conditioning units. In a further aspect, at least one of the first baffle or the second baffle comprises a door. In yet a further aspect, at least one of the baffles comprises a window.

In an aspect, a cover joins the first row of cabinets and the second row of cabinets, with the cover being configured to inhibit vertical airflow into and out of the cold aisle. In another aspect, the cover includes a translucent panel.

In an additional preferred embodiment, the invention provides a method of cooling heat-generating components housed in cabinets in a data center, the method comprising providing cool air to a first region between two rows of cabinets, including a first row and a second row that is substantially parallel to the first row, with a front face of at least one of the cabinets in the first row facing towards a front face of at least one of the cabinets in the second row; inhibiting the cool air from exiting the first region through the location between a first cabinet of the first row and a first cabinet of the second row; inhibiting the cool air from exiting the first region through the location between a last cabinet of the first row and a last cabinet of the second row; exhausting warm air from the heat-generating equipment through a chimney in communication with at least one of the cabinets to a second region above the first and second row; and inhibiting the warm air from entering the first region.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS OF THE INVENTION

This invention may be accomplished in an assembly for extracting heat from a housing for electronic equipment, the housing having a front, a back, two sides and a top, the assembly comprising a back for the housing that defines an open area proximate the top, and an air passageway in fluid communication with the open area in the back, to conduct heated air exiting the housing through the open area away from the housing. Typically, the front is perforated and the sides are solid, so that air flows into the housing through the front, through the electronic equipment located in the housing, and out of the housing through the open area, into the passageway.

Figure 1A:
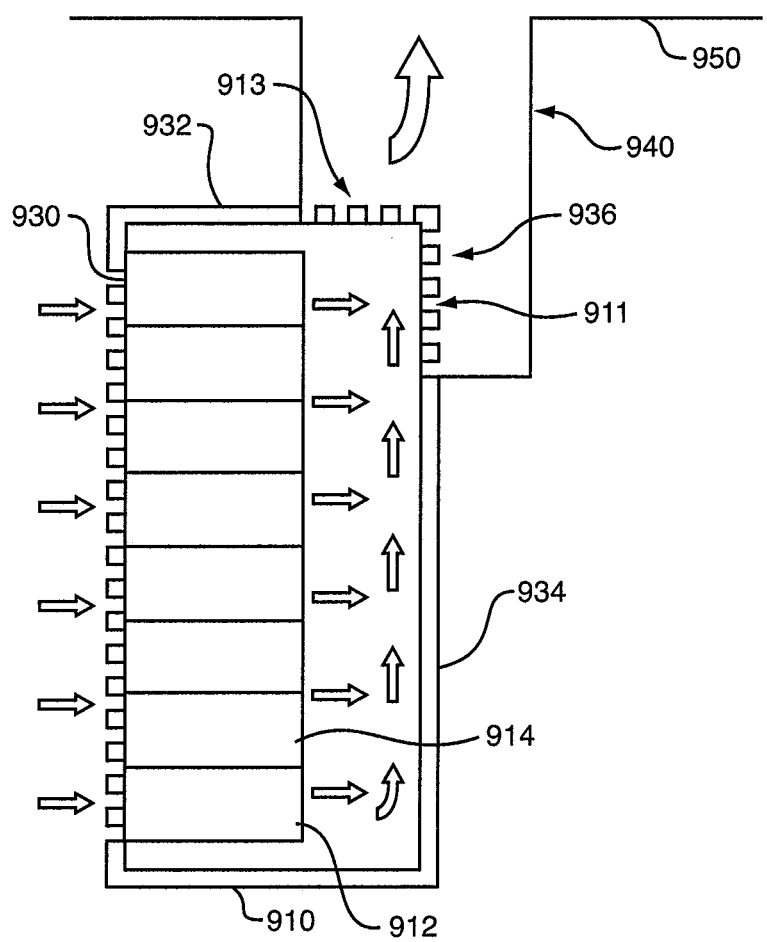
FIG. 1A is a schematic conceptual diagram of the assembly for extracting heat from a housing for electronic equipment of this invention.
Figure 1B:
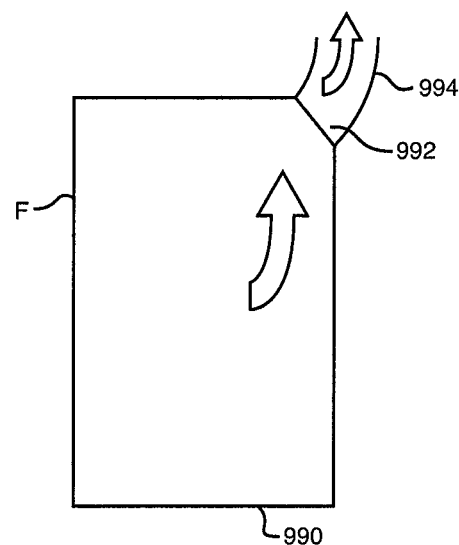
FIGS. 1B and 1C are similar drawings of two alternative embodiments of the invention.
Figure 1C:
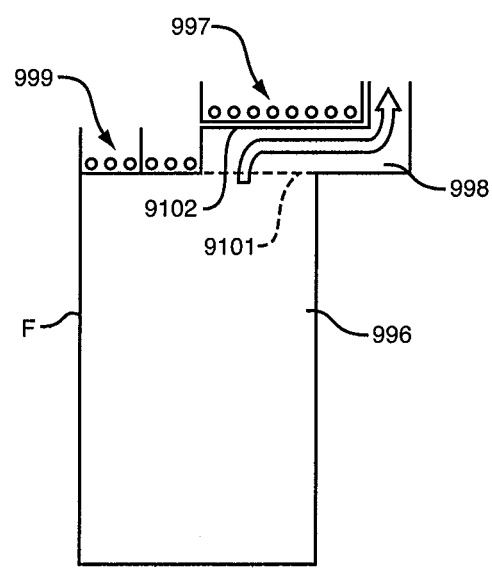

FIGS. 1A-1C schematically depict three concepts for accomplishing the invention, which is an assembly for extracting heat from a housing for electronic equipment. In this case, housing 910 may be a computer server rack such as a "Paramount" enclosure offered by Wright Line LLC of Worcester, Mass. Computer equipment rack 910 holds a number of modules or the like each comprising computer equipment: a series of vertically-arranged computer server modules 912, 914 ... 920 are shown. Rack 910 is a rectangular prism with front 930, top 932, and back 934. The two solid sides are not shown in the drawing. In accordance with the invention, back 934 is essentially solid except for open area 936 comprising opening or perforated area 911 in back 934 proximate top 932 and opening or perforated area 913 in top 932 proximate back 934. The open area 936 comprises some of the back, and may include an adjacent portion of the top as shown in this drawing. Air passageway 940 is in fluid communication with open area 936, to conduct heated air exiting housing 910 through open area 936 away from housing 910 and into enclosed air return ceiling area 950. Cool air enters housing 910 through perforated front door 930.

FIGS. 1B and 1C are two additional conceptual embodiments of the invention. Embodiment 990, FIG. 1B, has open area 992 at the top/back corner, with air passageway 994 communicating therewith. Air enters through front F. Embodiment 996, FIG. 1C, has open area 9101 in the top, with air passageway 998 communicating therewith. Air enters through front F. In this case, even though the heated air outlet is in the top (and could also be in some of the adjacent back, a feature not shown in this drawing), the top is still available to carry cables and/or other equipment by including raised top portion 9102, which forms part of passageway 998. Top portion 9102 can actually be the top of a rigid version of passageway 998, which may be accomplished with a duct. Cable trays 997 and 999 route cables or other equipment along the top.

Figure 2:
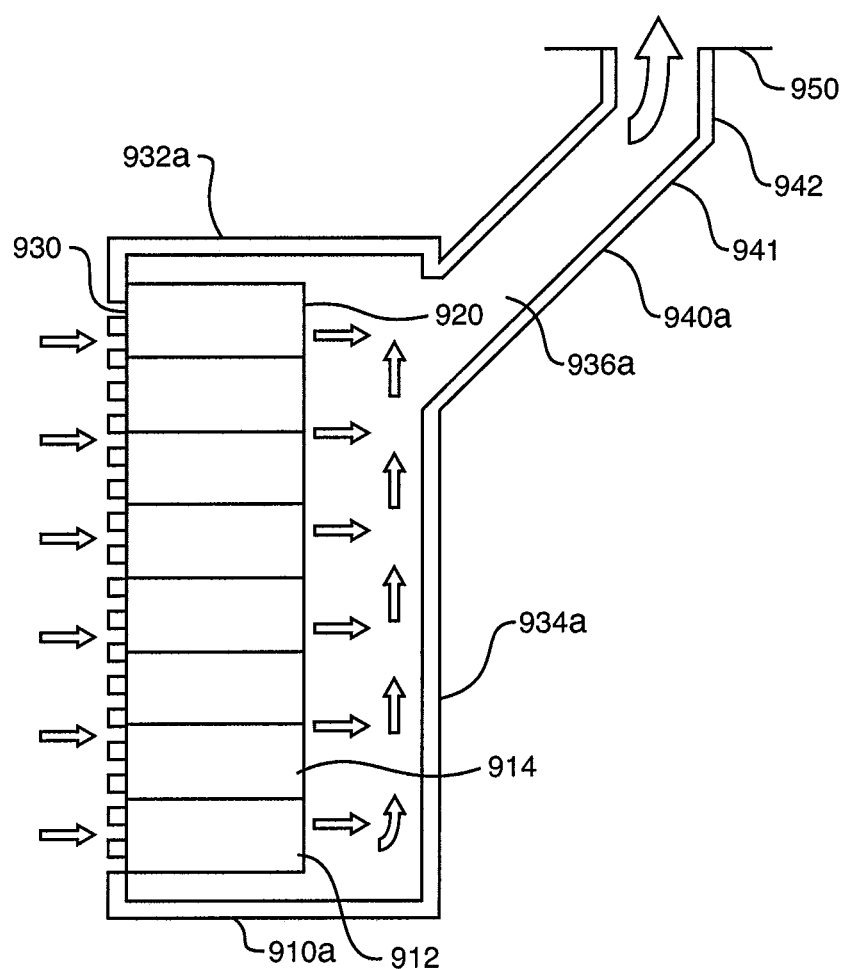
FIG. 2 is a schematic, cross-sectional view of another embodiment of the invention accomplished in a computer equipment rack with an assembly for extracting heat from the rack in accordance with the present invention.

One preferred embodiment of an assembly for extracting heat from a housing for electronic equipment is shown in FIG. 2. Computer equipment rack 910a holds a number of modules or the like each comprising computer equipment: a series of vertically-arranged modules 912, 914 ... 920 are shown. Rack 910a is typically a rectangular prism shape, and has a perforated front 930, top 932a, and back 934a; the solid side panels are not shown. In accordance with the invention, back 934a is essentially solid except for open area 936a proximate top 932a. Air passageway 940a is in fluid communication with open area 936a, to conduct heated air exiting housing 910a through open area 936a away from housing 910a. Air passageway 940a in this example comprises first section 941 that is angled at about 45 degrees up and away from the plane of back 934a, and more vertical section 942 that leads to enclosed air return ceiling area 950. Cool air enters housing 910a through perforated front door 930.

The invention contemplates any reasonable arrangement of an air passageway that is in fluid communication with an open area at the top of the back and/or the back of the top. The open area preferably extends across at least a majority of the width of the back of the housing, and may also encompass a portion of the top of the housing adjacent to the back, as shown in FIGS. 1A and 1B. In the preferred embodiment, a significant portion of the top is essentially solid so that the majority (or all) of the top area of the housing is available for routing cables and holding other peripheral equipment that is necessary in a data center, as shown in FIG. 1C. This contrasts the invention with racks that have one or more openings in the top that directly vent heated air into the room or a vertical duct but that take away area from the top of the racks that could otherwise be used for routing other data center equipment, such as power and data cables and the like.

The open area can be any shape or arrangement. The assembly of this invention can be installed in a new equipment rack or offered as an after-market product with a back having a particular size, shape and location of an open area, and an air passageway that may be accomplished with one or more flexible or inflexible ducts or conduits, depending upon the particular arrangement.

Figure 3:
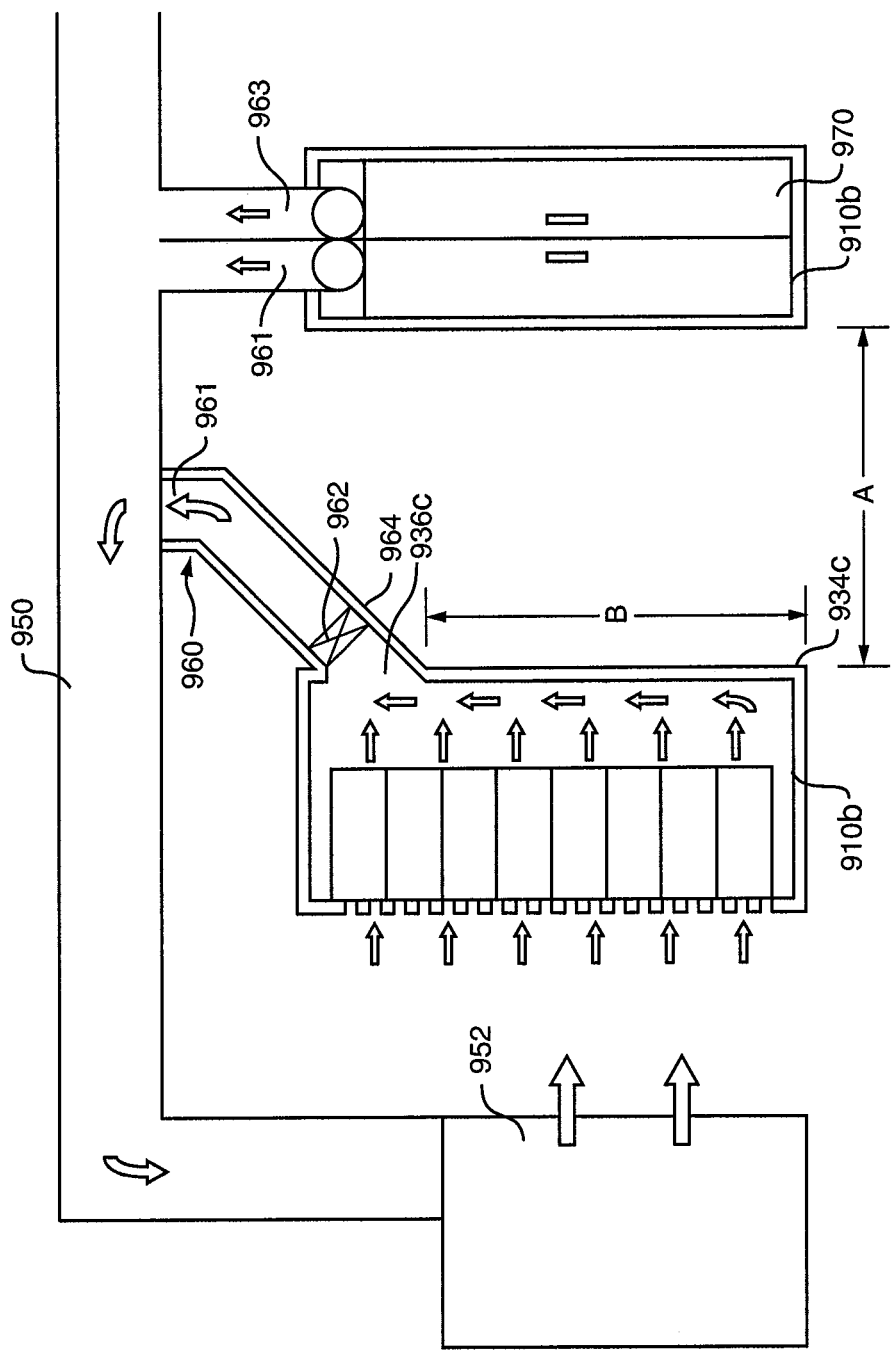
FIG. 3 is a similar view showing two adjacent racks in a data center arrangement according to this invention.

Once such particular arrangement is shown in FIG. 3, which illustrates two adjacent identical racks 910b, one in cross section and one in a rear view. Air passageway 960 comprises two side-by-side essentially identical circular flexible ducts 961 and 963 that are coupled to the upper back area of each of equipment rack 910a (viewed from the side) and rack 910b (viewed from the back, in which split rear door 970, located below ducts 961 and 963, is visible). This drawing also illustrates one option in which an air-moving device 962 is placed in air passageway 960, or in fluid communication therewith, to assist the movement of air.

Overall airflow is depicted in the drawings by the solid arrows. Preferably, the solid front door of the rack is replaced with a perforated front that has a series of openings, somewhat like a screen door. This allows cooled room air to enter the front of the rack and pass through equipment modules 912, 914 ... 920. Heated air flows out through the back of these modules, typically assisted by fans located in the modules themselves. The heated air is naturally buoyant and rises along back 934c and out through open area 936c. The inventive assembly thus acts somewhat like a chimney in that it is a passageway to allow heated air to escape from the inside of a housing for electronic equipment.

FIG. 3 also illustrates an embodiment of a data center arrangement according to this invention comprising two or more electronic equipment racks 910a and 910b. In this embodiment, racks 910a and 910b are essentially equivalent to rack 910, FIG. 1, except for the particular arrangement of the open area in backs 934c near the tops of the racks. Air passageways 960 connect these openings to enclosed ceiling area 950 which leads to air conditioning unit 952 that cools the air and blows it back into the data center so that it can enter the perforated front of racks 910a and 910b. Air-moving devices 962 may not be necessary if there is sufficient pressure drop in ceiling area 950 to draw the heated air up into area 950; this is a detail that depends on the particular arrangement of the data center.

The invention accomplishes efficient cooling of electronic equipment in the housing without the need for deep rear doors having internal fans and ducting that withdraws heated air out of the housing and blows it out of the top of the door, of the type known in the art. The invention thus accomplishes efficient cooling without increasing the depth of the equipment rack up to the height B off of the floor at which the air passageway projects from the housing. This allows racks to be separated by a minimum width A. Dimensions A and B may be dictated by local, state and/or federal regulations, such as the Americans with Disability Act (ADA) and/or the National Fire Protection Association (NFPA) codes. In one example, regulations require an 80" unobstructed headroom height (which can establish the minimum height "B"), and a minimum aisle width of 36" (which can establish the minimum inter-rack spacing "A"). Regardless of the minimum dimensional needs, the invention accomplishes a maximum density of equipment housings in a data center area, as it does away with the need for thickened front and/or rear doors that have been necessary to accommodate air-handling equipment.

The invention also provides improved systems and methods for heat containment and cold air isolation in data centers.

Figure 4:
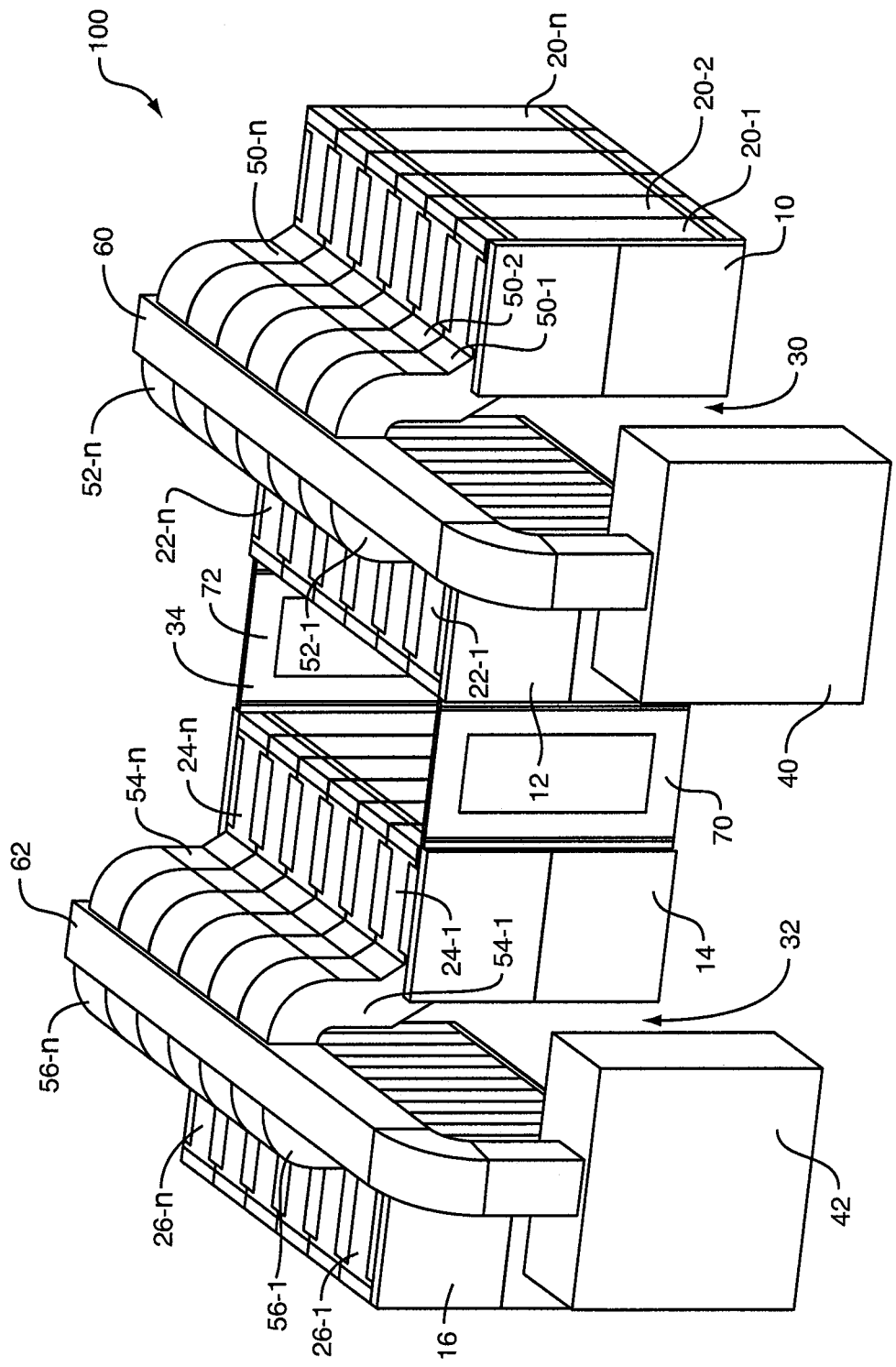
FIG. 4 is a perspective representation of a data center utilizing a closed loop heat containment and cold aisle isolation system according to a preferred embodiment of the present invention, in which the warmed air from the cabinets is exhausted into a below-ceiling duct.
Figure 5:
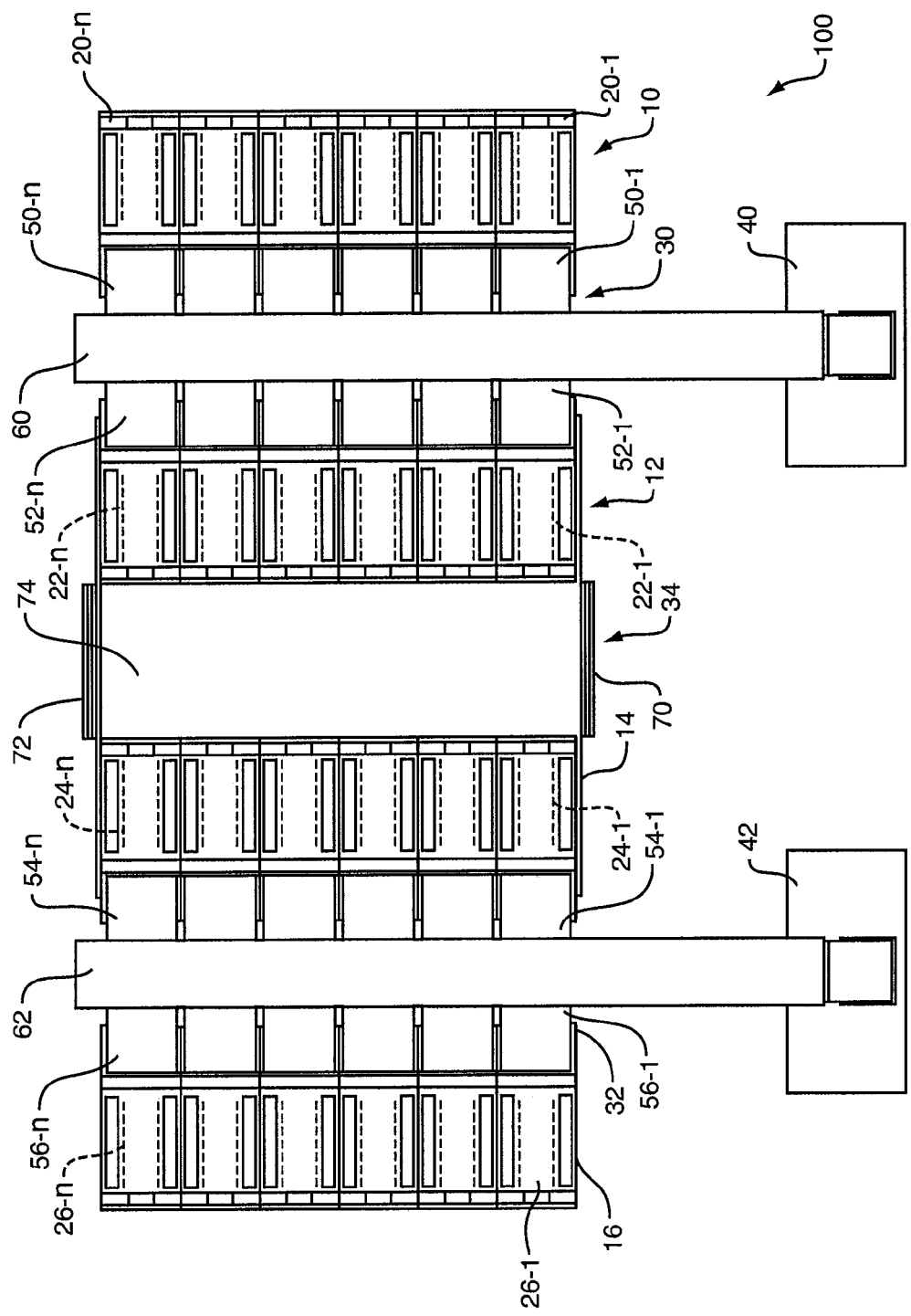
FIG. 5 is a top representation of the data center of FIG. 4.
Figure 6:
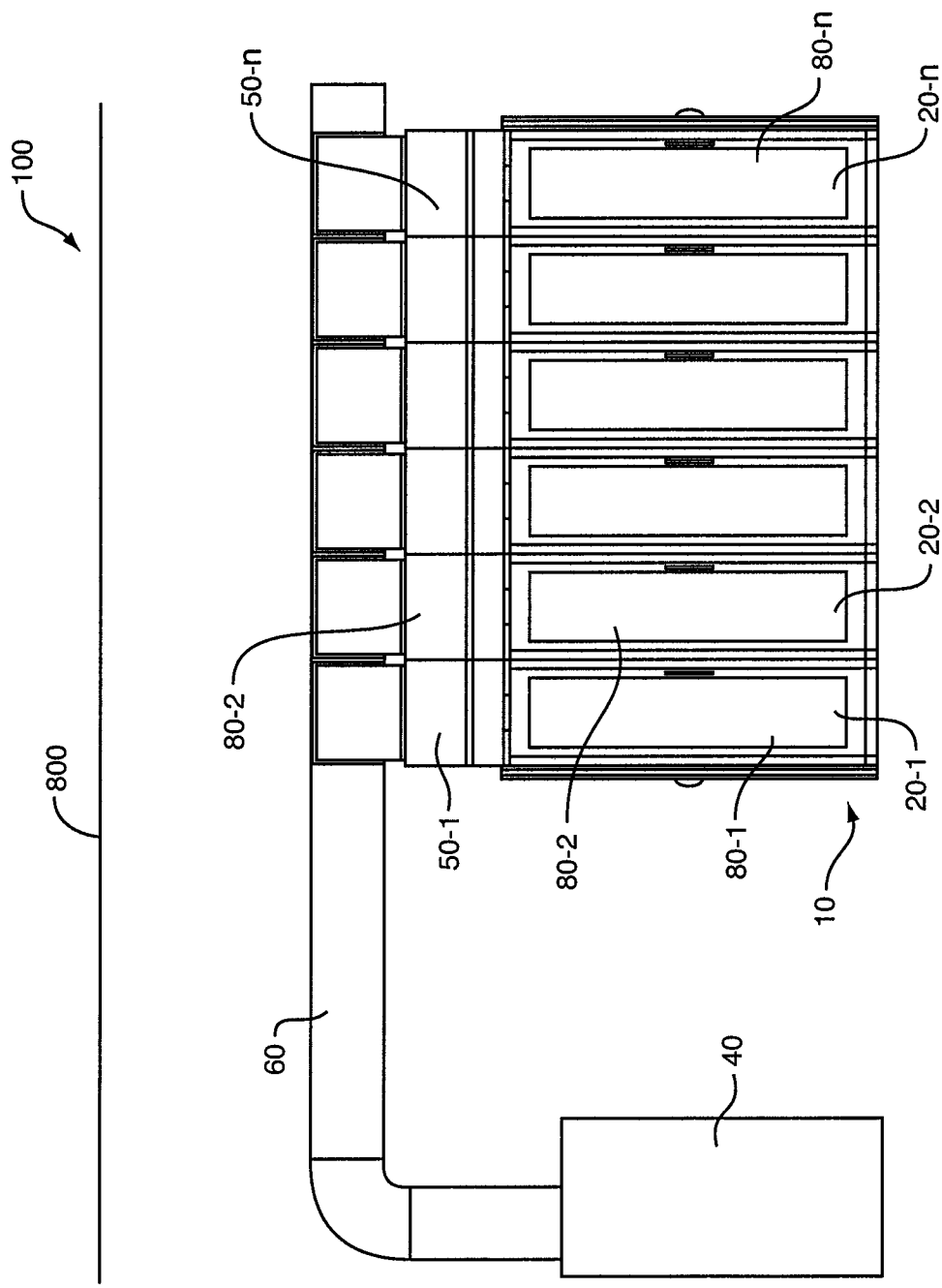
FIG. 6 is a side representation of the data center of FIG. 4.

With reference to FIGS. 4, 5 and 6, in a preferred embodiment, a data center 100 comprises one or more rows 10, 12, 14 and 16 of adjacent cabinets or enclosures, such as cabinets 20-1, 20-2 . . . 20-n in row 10; cabinets 22-1, 22-2 . . . 22-n in row 12; cabinets 24-1, 24-2 . . . 24-n in row 14; and cabinets 26-1, 26-2 . . . 26-n in row 16.

Figure 7A:
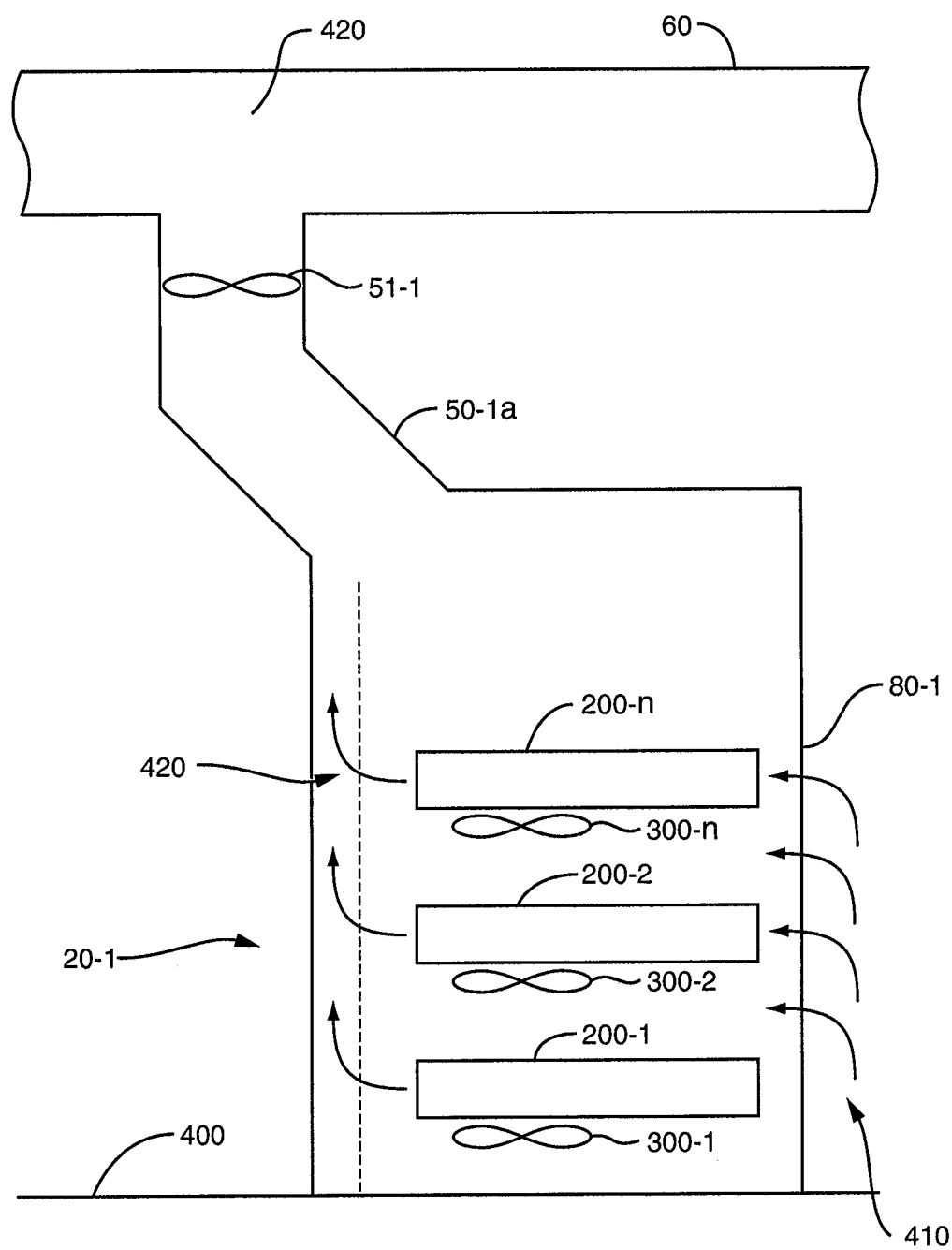
FIG. 7A is a side view of a first embodiment of a cabinet with a chimney, according to a preferred embodiment of the invention, in which cool air enters the cabinet through a perforated front panel or door, and the chimney is attached to the top and rear of the cabinet.
Figure 7B:
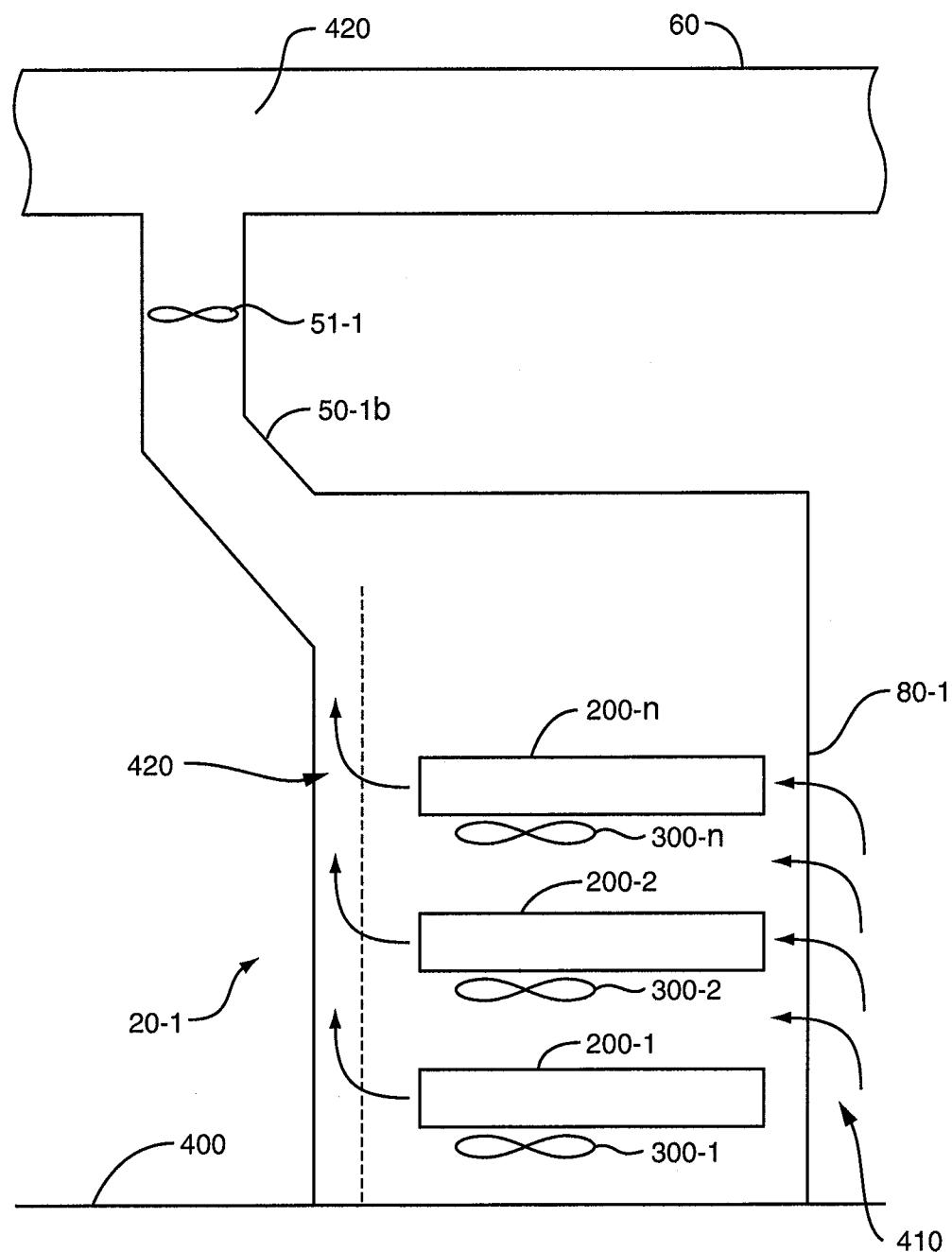
FIG. 7B is a side view of a second embodiment of a cabinet with a chimney, according to a preferred embodiment of the invention, in which cool air enters the cabinet through a perforated front panel or door, and the chimney is attached to the rear of the cabinet.
Figure 7C:
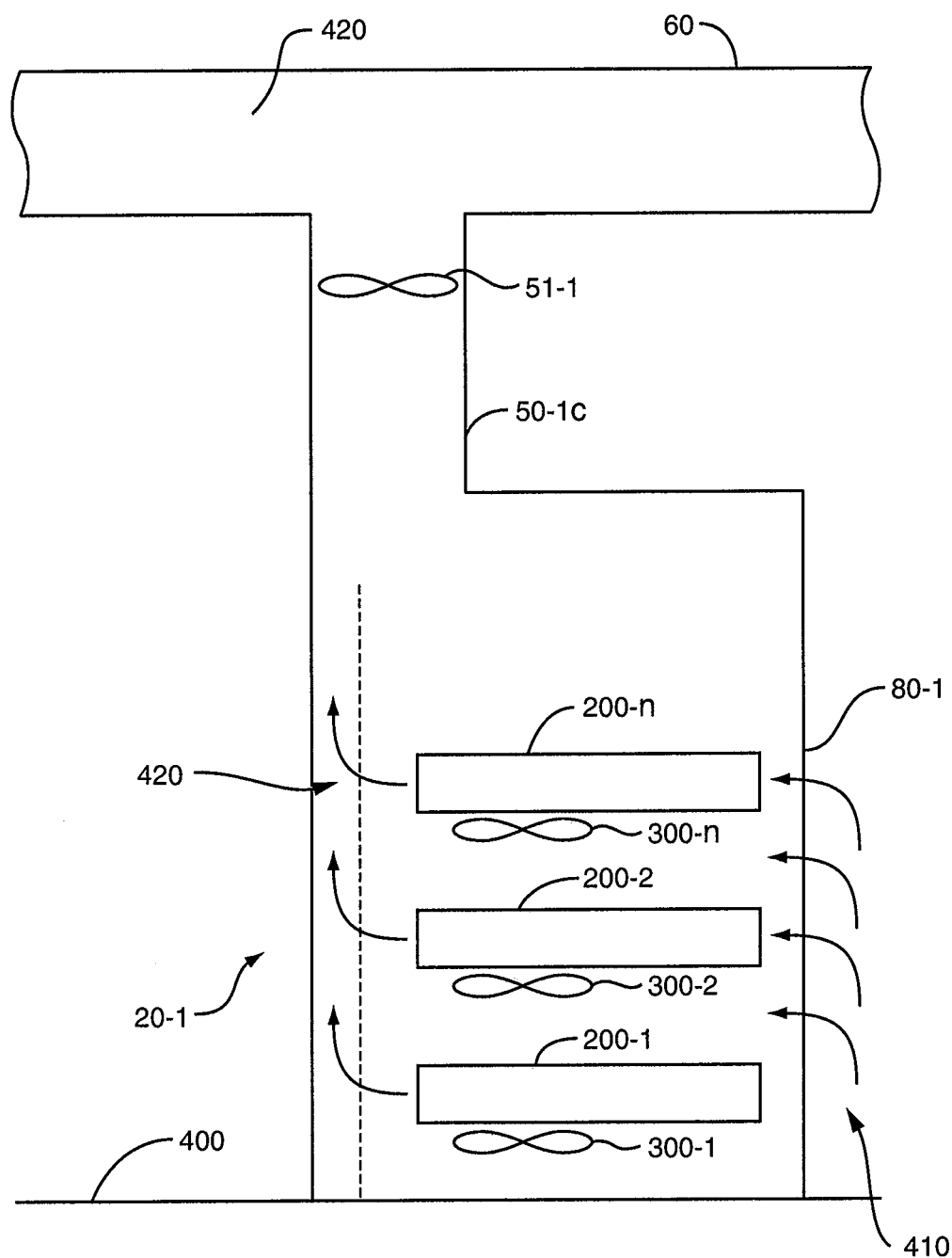
FIG. 7C is a side view of a third embodiment of a cabinet with a chimney, according to a preferred embodiment of the invention, in which cool air enters the cabinet through a perforated front panel or door, and the chimney is attached to the top of the cabinet.

With reference to FIGS. 7A, 7B and 7C, each cabinet, such as cabinet 20-1, may contain one or more heat-generating computer or IT equipment elements 200-1, 200-2 . . . 200-n, including but not limited to file servers, database servers, data processors, and network routers. As is known in the art, each cabinet may include a perforated front panel or door, such as door 80-1 of cabinet 20-1, to allow cool air to circulate into and within the cabinets. Each cabinet may also include a solid rear or back door. Each cabinet may also include one or more fans, such as fans 300-1, 300-2 . . . 300-n, to create a forced airflow within the cabinet.

Figure 7D:
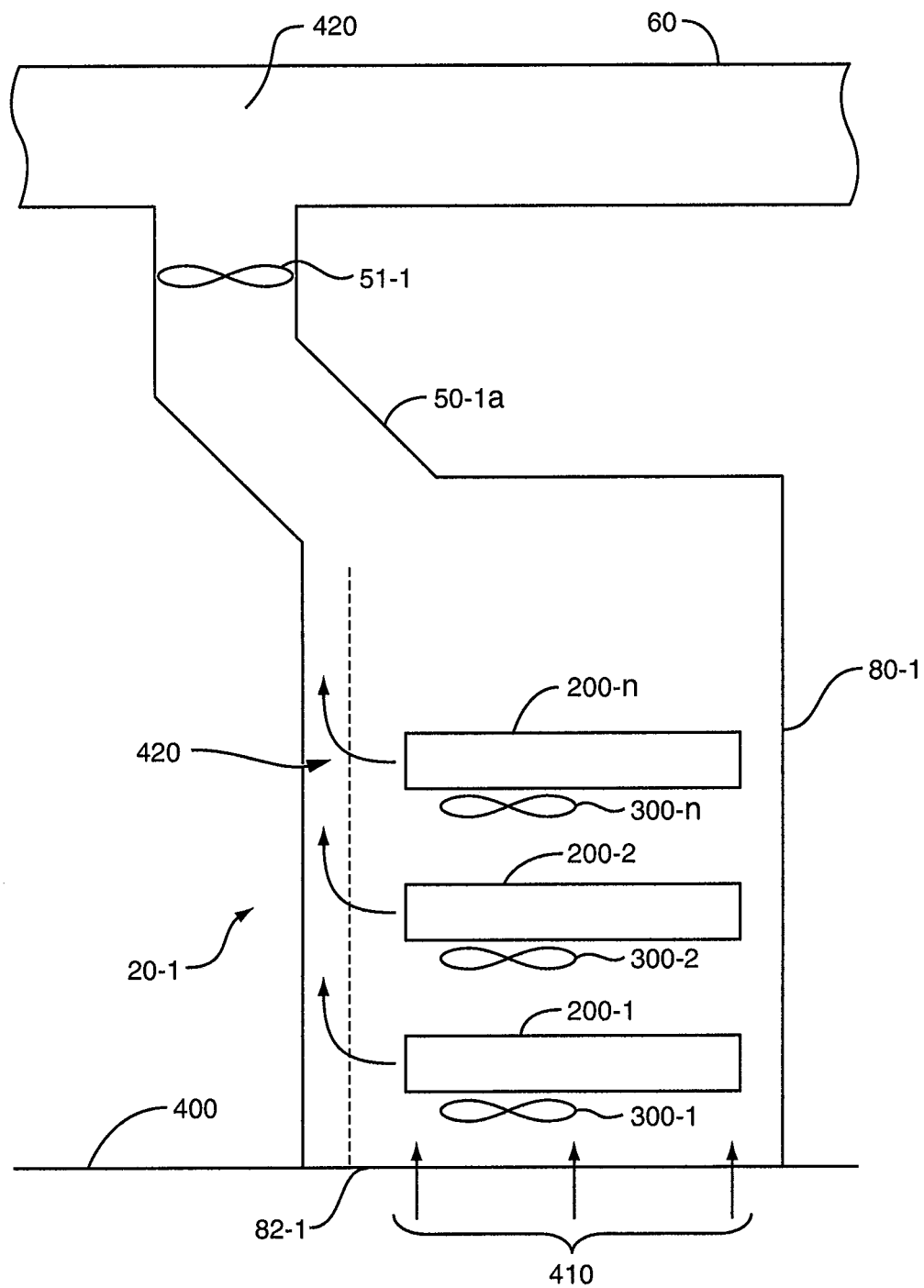
FIG. 7D is a side view of a fourth embodiment of a cabinet with a chimney, according to a preferred embodiment of the invention, in which cool air enters the cabinet through the bottom of the cabinet, and the chimney is attached to the top and rear of the cabinet.
Figure 7E:
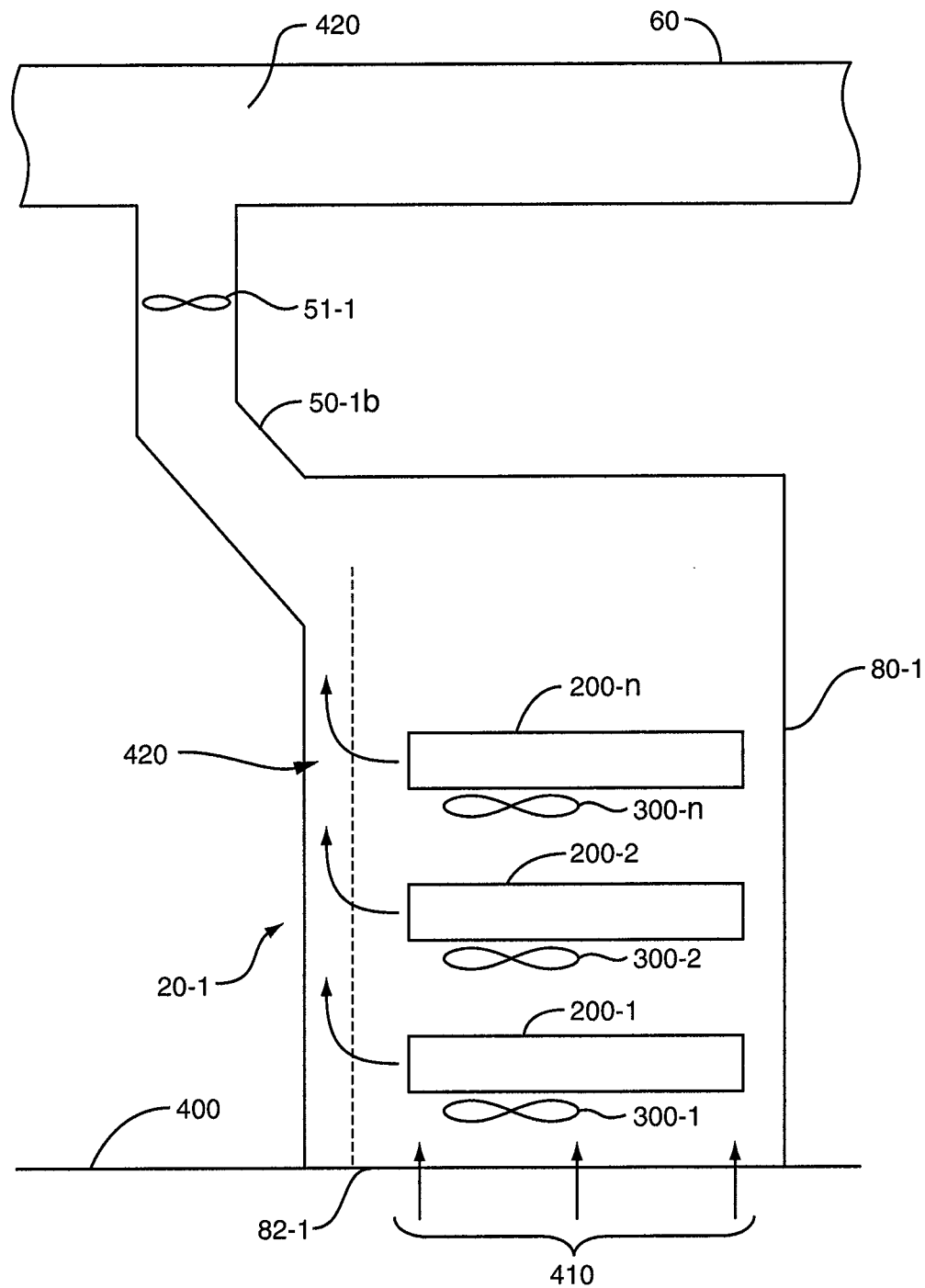
FIG. 7E is a side view of a fifth embodiment of a cabinet with a chimney, according to a preferred embodiment of the invention, in which cool air enters the cabinet through the bottom of the cabinet, and the chimney is attached to the rear of the cabinet.
Figure 7F:
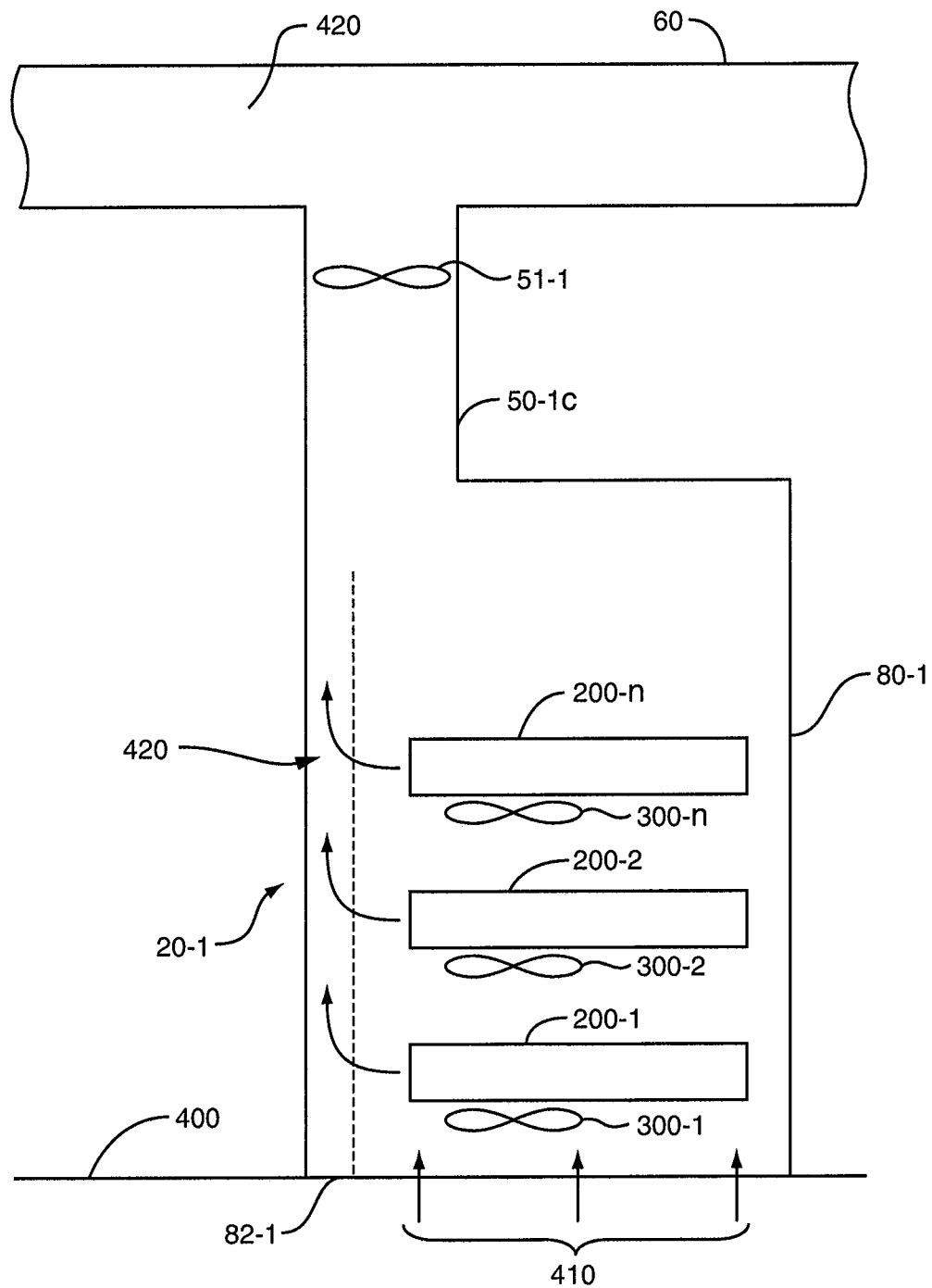
FIG. 7F is a side view of a sixth embodiment of a cabinet with a chimney, according to a preferred embodiment of the invention, in which cool air enters the cabinet through the bottom of the cabinet, and the chimney is attached to the top of the cabinet.

In alternate embodiments, as shown in FIGS. 7D, 7E and 7F, each cabinet, such as cabinet 20-1, may include a solid front panel or door, 80-1, and a substantially open or perforated bottom, such as bottom 82-1, through which cool air circulates into the cabinets.

With further reference to FIGS. 4, 5 and 6, in a preferred embodiment, the heat-generating equipment in the cabinets is cooled by cool air generated by one or more air conditioning units 40 and 42, although the number of air conditioning units may vary as required by the characteristics of the data center. In alternate embodiments, the heat-generating equipment in the cabinets is cooled by cool air generated by the building's air conditioning system, or a combination the building's air conditioning system and the data center's dedicated air conditioning units 40 and 42.

As shown in FIGS. 7A, 7B and 7C, the cool air 410 may be supplied from the air conditioning units 40 and 42 through the perforated tiles of an elevated floor 400 in data center 100. Alternatively, or in addition, the cool air may be piped directly into the data center 100 using systems and methods known in the art. For example, in an embodiment, the cool air may be ducted directly into the cold aisles of the data center from above, rather than through the perforated tiles of an elevated floor.

In a preferred embodiment, and with further reference to FIGS. 6 and 7A, 7B and 7C, cool air enters the cabinets through perforated panels or doors, such as the perforated doors 80-1, 80-2 . . . 80-n located at the front of the cabinets 20-1, 20-2 . . . 20-n. In alternate embodiments, and with further reference to FIGS. 7D, 7E and 7F, cool air enters the cabinets through substantially open or perforated bottoms, such as bottoms 82-1, 82-2 . . . 82-n.

The air heated by the computer equipment, such as computer equipment 200-1, 200-2 . . . 200-n in cabinet 20-1, exits the cabinet through the back and/or top of the cabinet. In a preferred embodiment, and as shown in FIGS. 4, 5, 6 and 7A-7F, heated air 420 is contained and directed through the chimneys connected to the top, rear or top and rear of the cabinets, such as chimneys 50-1, 50-2 . . . 50-n, coupled to cabinets 20-1, 20-2 . . . 20-n; chimneys 52-1, 52-2 . . . 52-n, coupled to cabinets 22-1, 22-2 . . . 22-n; chimneys 54-1, 54-2 . . . 54-n, coupled to cabinets 24-1, 24-2 . . . 24-n; and chimneys 56-1, 56-2 . . . 56-n, coupled to cabinets 26-1, 26-2 . . . 26-n. The chimneys prevent the heated air exiting the cabinets from mixing with the cooler air entering the cabinets, thus isolating the two airflows. As shown in FIGS. 7A and 7D, in a preferred embodiment, the chimneys, such as chimney 50-1a, may be mounted at the top and rear of cabinet 20-1. In alternate embodiments, the chimneys, such as chimney 50-1b, may be mounted at the rear of cabinet 20-1, as shown in FIGS. 7B and 7E, or at the top of cabinet 20-1, as shown in FIGS. 7C and 7F. As shown in FIGS. 7A, 7B, 7D, and 7E, the chimneys may extend out from the rear of the cabinet, at an angle in the range of approximately zero to 180 degrees, and preferably about 45 degrees. The chimneys may also include one or more fans, such as fan 51-1.

In a preferred embodiment, heated air may be returned to the air conditioning units 40 and 42 through ducts 60 and 62, respectively, which are located below the ceiling 800 and are coupled to the chimneys, as shown in FIGS. 4, 5 and 6. Returning the heated air directly to the air conditioning units allows the air conditioning units to operate more efficiently. In preferred embodiments, ducts 60 and 62 may include baffles and/or fans (not shown) to control the air pressure within the ducts. The ducts 60 and 62 may be instrumented to monitor the air pressure, and the baffles and/or fans may be manually or remotely controlled, using methods known in the art. In additional embodiments, baffles and/or fans may also be located in the air conditioning systems' return plenums, which may also be instrumented to monitor the air pressure, and may also be manually or remotely controlled.

With further reference to FIGS. 4 and 5, rows 10, 12, 14 and 16 may be arranged to form aisles. In a preferred embodiment, the fronts of the cabinets in rows 12 and 14 face each other to form a cold aisle 34. Correspondingly, the backs of the cabinets in row 12 face the backs of the cabinets in row 10 to form hot aisle 30, and the backs of the cabinets in row 14 face the backs of the cabinets in row 16 to form hot aisle 32.

As shown in FIGS. 4 and 5, cold aisle 34 may be isolated from the rest of the data center 100 by adding baffles to obstruct the flow of warm air into the cold aisle, such as doors 70 and 72 at opposing ends of the cold aisle 34. In alternate embodiments, one of the doors 70 or 72 may be replaced with a fixed panel. In addition, one or both of the doors 70 or 72 may include a translucent panel as a window to allow light to enter the cold aisle. The translucent panel may be Plexiglas®, but other materials, including but not limited to glass and Lucite®, are contemplated and within the scope of the invention.

In addition, in a preferred embodiment, the cold aisle 34 may be further isolated from the rest of the data center 100 by adding an optional roof or cover 74. Roof 74 is preferably made of a translucent material, such as Plexiglas®, but other materials, including but not limited to glass and Lucite®, are contemplated and within the scope of the invention.

Figure 8A:
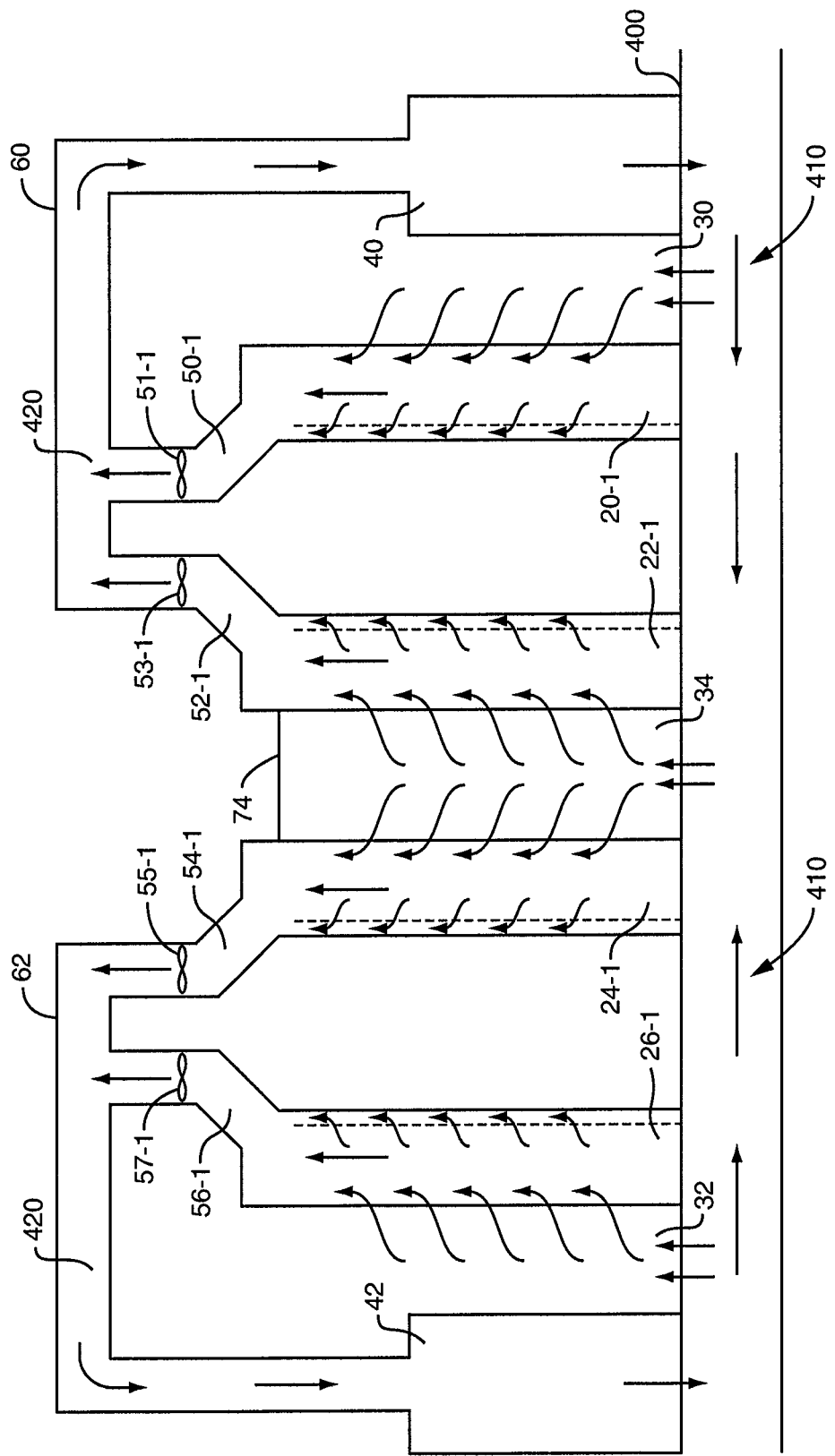
FIG. 8A is a representation of the airflow management within the data center of FIG. 4, where the cool air enters the cabinets through perforated front panels or doors.
Figure 8B:
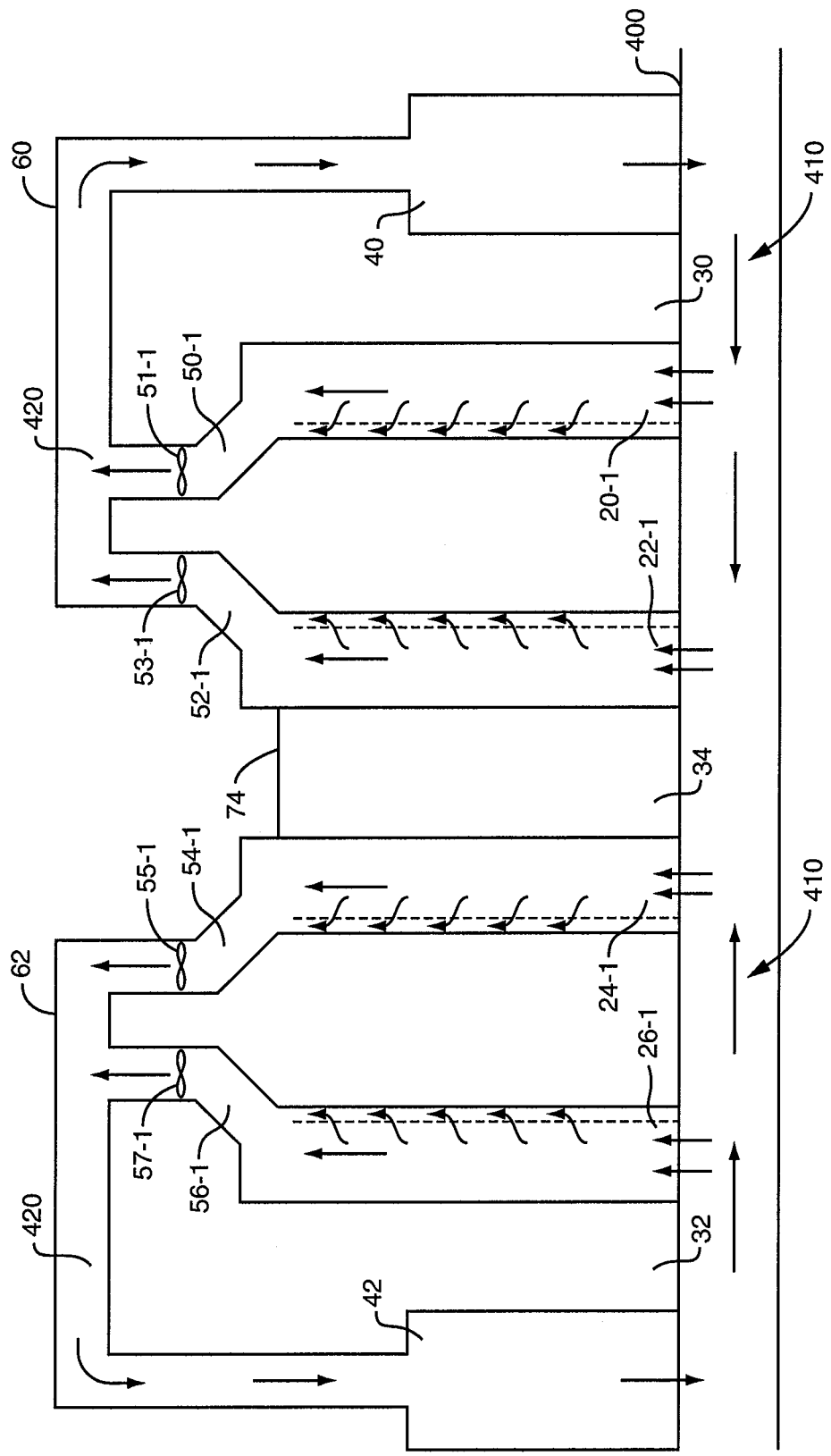
FIG. 8B is a representation of the airflow management within the data center of FIG. 4, where the cool air enters the cabinets through the bottoms of the cabinets.

FIGS. 8A and 8B are representations of the airflow management, and specifically the combination of cold air isolation and heat containment, of the data center shown in FIGS. 4, 5, and 6, and described above.

As shown in FIGS. 8A and 8B, and with reference to FIGS. 4, 5 and 6, cooled air 410 from air conditioning units 40 and 42 enters the data center 100 through perforated tiles in raised floor 400, and/or through the bottoms of the cabinets. Alternatively, or in addition, cooled air 410 from air conditioning units 40 and 42 may be ducted directly into data center 100. For example, cooled air 410 may be ducted directly into the cold aisles of the data center from above, in addition to, or instead of, entering the data center 100 through the perforated tiles in raised floor 300 and/or through the bottoms of the cabinets.

With reference to FIG. 8A, cooled air 410 is drawn through the fronts of the cabinets, such as the fronts of the cabinets 22-1 and 24-1 in rows 12 and 14 located in cold aisle 34, and the fronts of cabinets 26-1 and 20-1. In an alternate embodiment, as shown in FIG. 8B, cooled air 410 is drawn through the bottoms of the cabinets, such as the bottoms of the cabinets 22-1 and 24-1 in rows 12 and 14 located in cold aisle 34, and the bottoms of cabinets 26-1 and 20-1.

As shown in FIGS. 8A and 8B, the cooled air circulates within the cabinets, and warmed air 420 exits the interior of the cabinets at the top of the cabinets. Warmed air 420 is directed through the chimneys, such as chimneys 50-1, 52-1, 54-1 and 56-1, and returned through ducts 62 and 60 to air conditioning units 40 and 42. In a preferred embodiment, the chimneys include one or more fans, such as 51-1, 53-1, 55-1 and 57-1, to facilitate the circulation of air through the cabinets.

Figure 9:
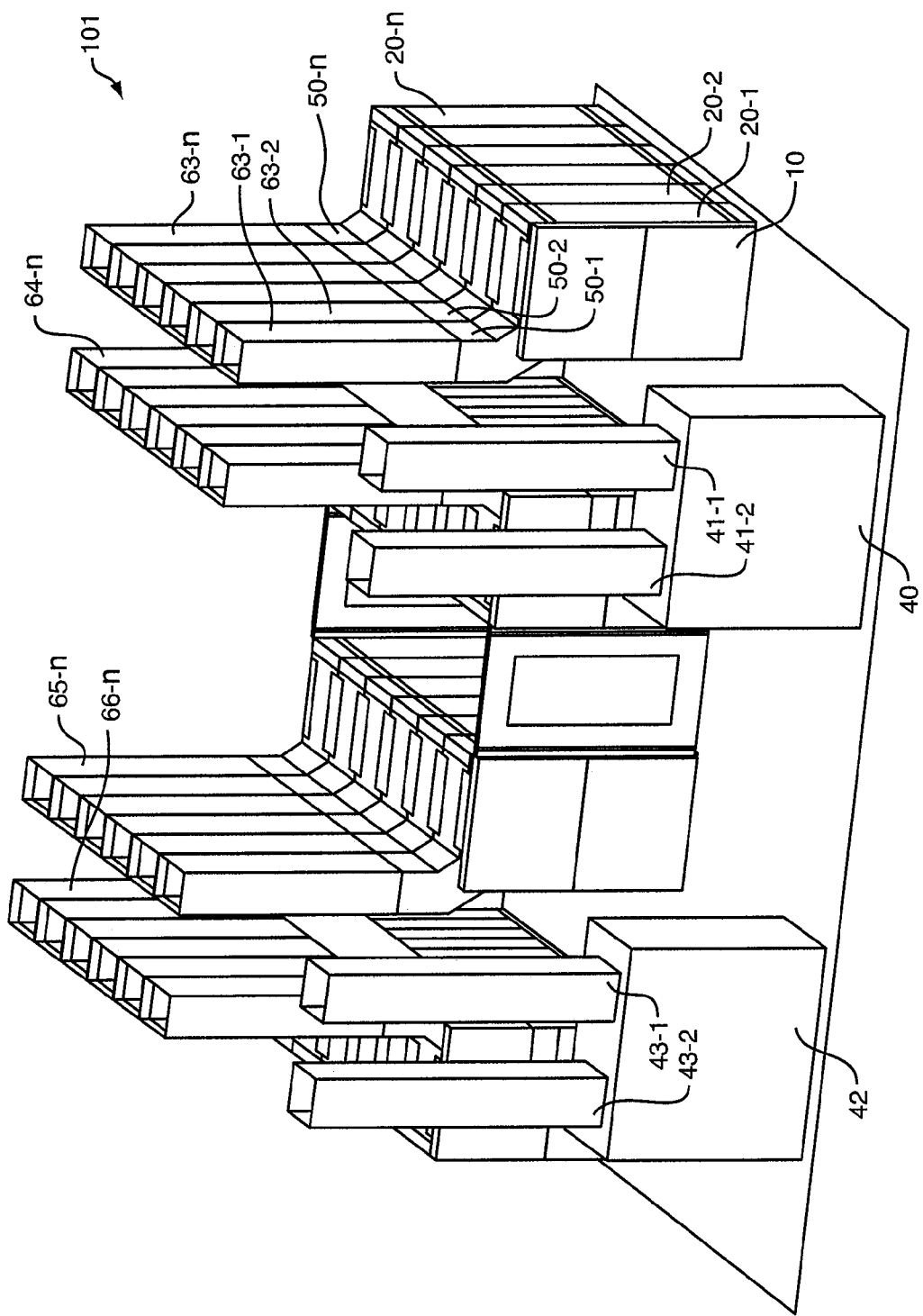
FIG. 9 is a perspective representation of a data center according to alternate embodiment of the invention, in which the warmed air from the cabinets is exhausted at a high elevation within the data center.
Figure 10:
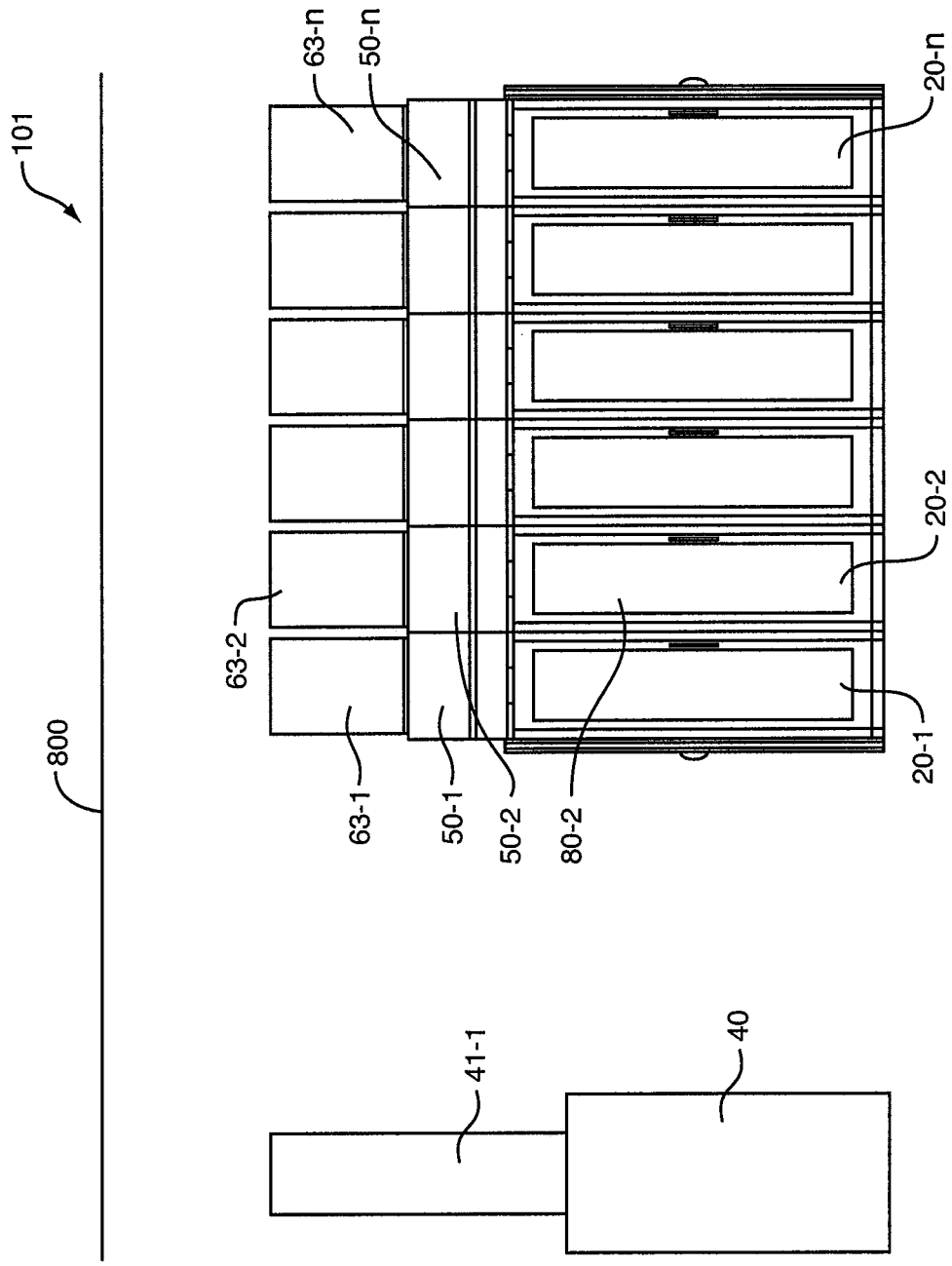
FIG. 10 is a side representation of the data center of FIG. 9.

In an alternate embodiment, and as shown in FIGS. 9 and 10, the warm air from the cabinets is exhausted high into the room through vertical ducts, such as ducts 63-1, 63-2 . . . 63-n of cabinets 20-1, 20-2 . . . 20-n. The ducts are located below the ceiling 800. The computer room air conditioners 40 and 42 intake the warm air through intake ducts 41-1, 41-2, 42-1, and 42-2. Ducts 41-1, 41-2, 42-1, and 42-2 may contain baffles and/or fans (not shown) to control the air pressure within the ducts. The ducts may be instrumented to monitor the air pressure, and the baffles and/or fans may be manually or remotely controlled, using methods known in the art. The number of air conditioners and air intake ducts may vary, according to the characteristics of the data center 101. In additional embodiments, the heat-generating equipment in the cabinets is cooled by cool air generated by the building's air conditioning system, or a combination of the building's air conditioning system and the data center's dedicated air conditioning units 40 and 42.

Figure 11:
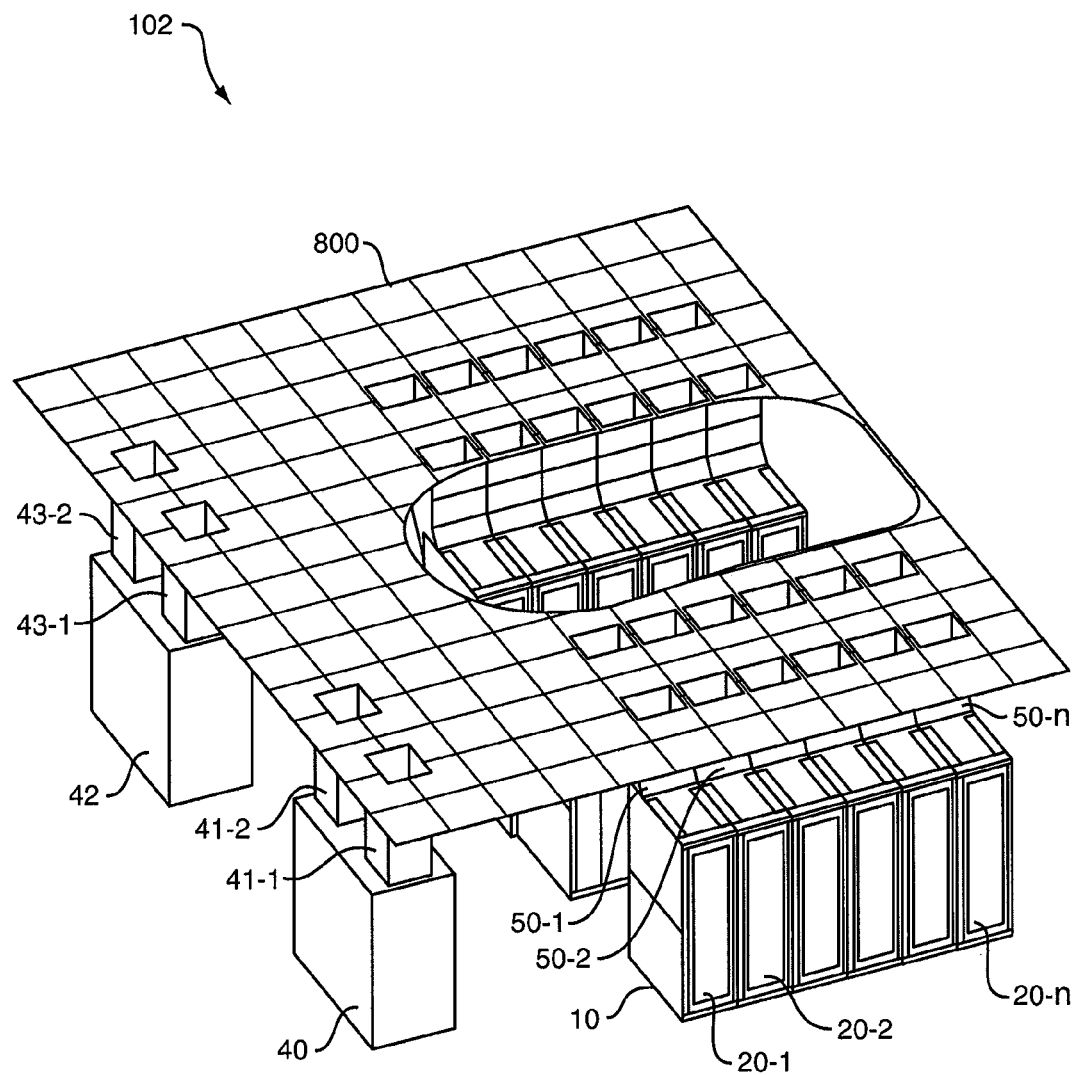
FIG. 11 is a perspective representation of a data center according to an alternate embodiment of the invention, in which the warmed air from the cabinets is exhausted into a pressurized ceiling plenum or suspended ceiling.
Figure 12:
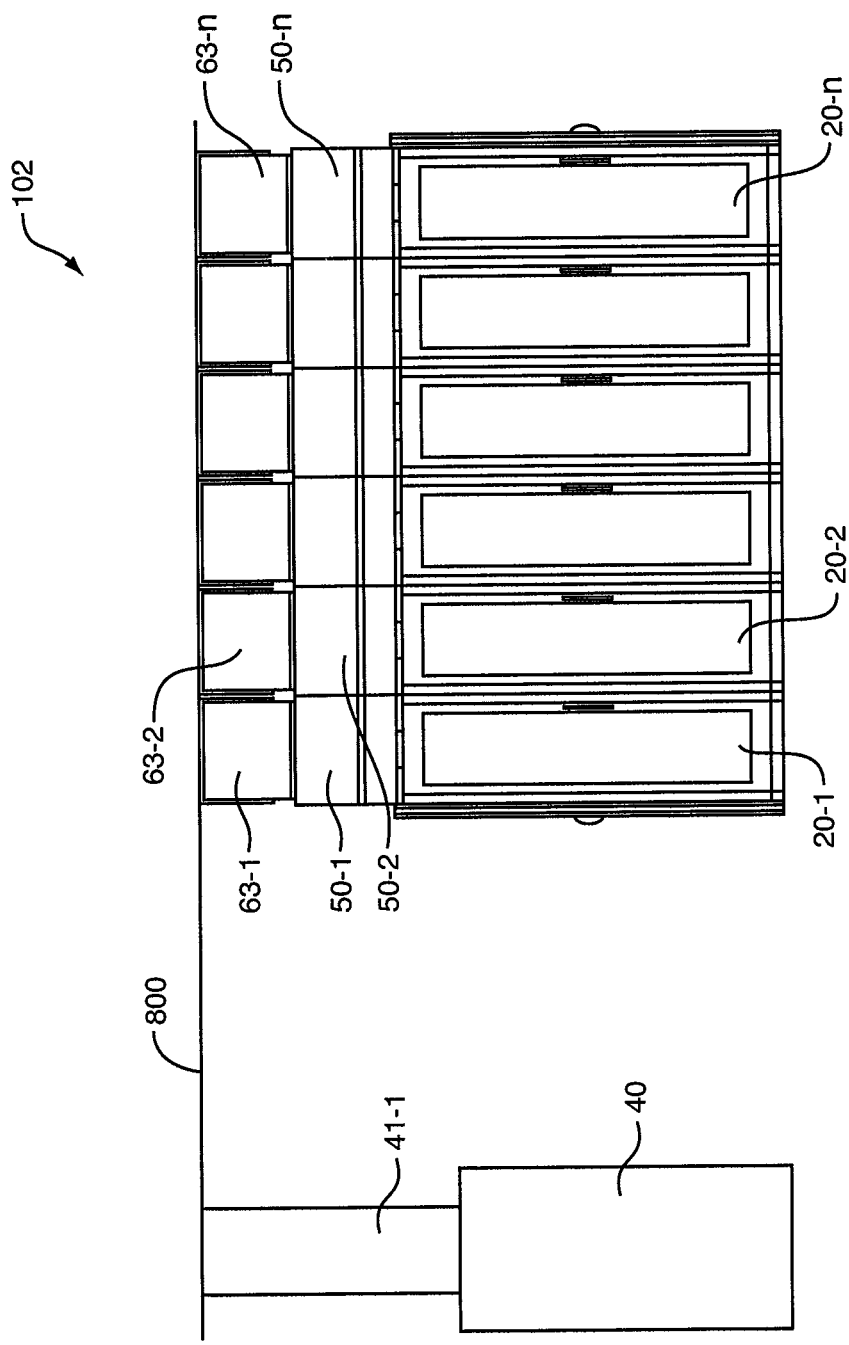
FIG. 12 is a side representation of the data center of FIG. 9.

In yet another embodiment, and as shown in FIGS. 11 and 12, the warm air from the cabinets is exhausted into a pressurized ceiling plenum or suspended ceiling 800, through vertical ducts, such as ducts 63-1, 63-2 . . . 63-n of cabinets 20-1, 20-2 . . . 20-n. The computer room air conditioners 40 and 42 intake the warm air through intake ducts 41-1, 41-2, 42-1, and 42-2. The ducts and/or the plenum or ceiling may contain baffles and/or fans (not shown) to control the air pressure within the ducts and/or plenum or ceiling. The ducts and/or plenum or ceiling may be instrumented to monitor the air pressure, and the baffles and/or fans may be manually or remotely controlled, using methods known in the art. The number of air conditioners and air intake ducts may vary, according to the characteristics of the data center 101.

Figure 13:
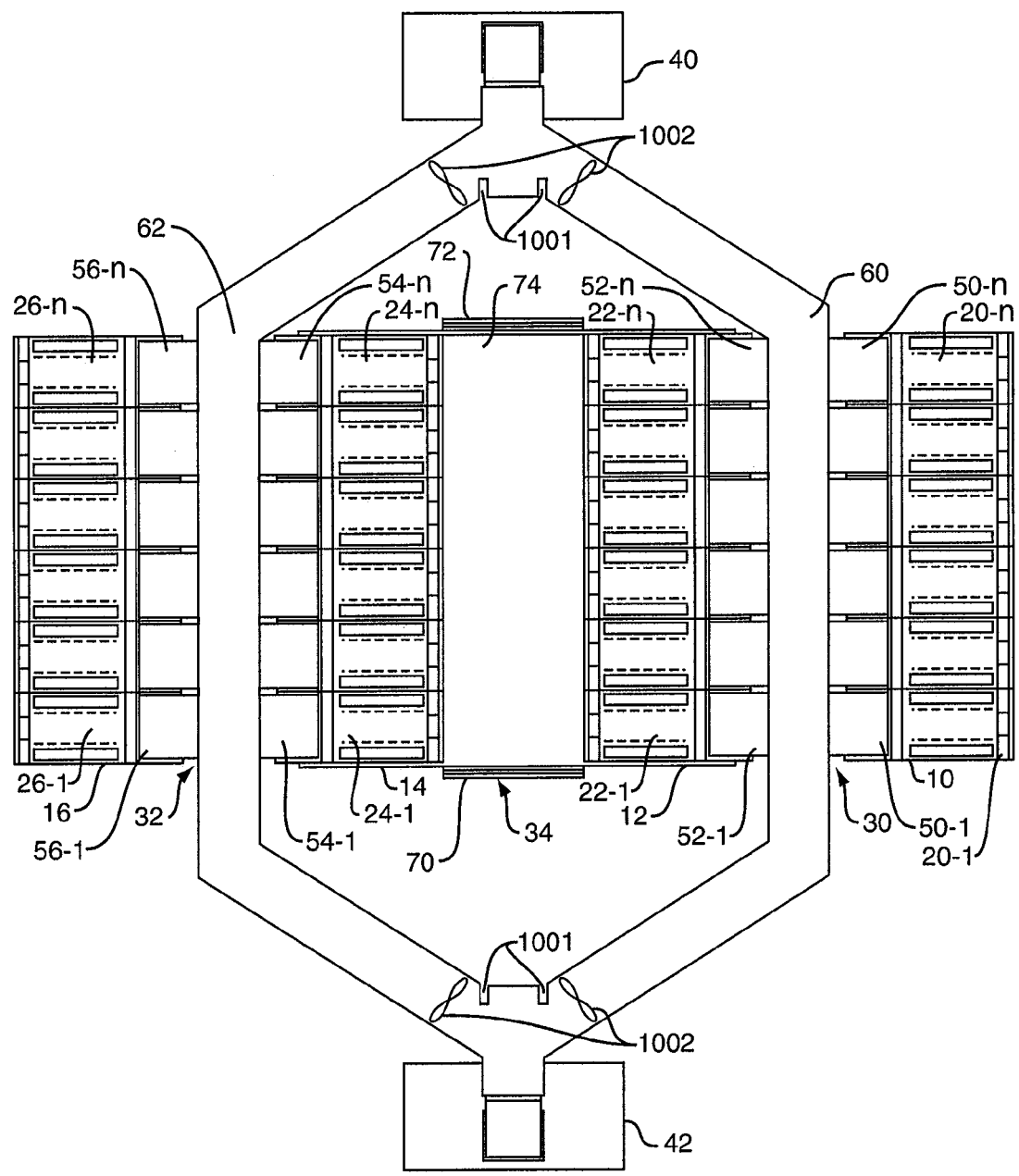
FIG. 13 is a top representation of a data center utilizing a closed loop heat containment and cold aisle isolation system according to a preferred embodiment of the invention, in which each air conditioning unit is configured to selectively service one or more rows of cabinets through the use of baffles and/or fans.

In a preferred embodiment, and as shown in FIG. 13, each air conditioning unit 40 and 42 may be configured to selectively service one or more rows of cabinets through the use of baffles 1001 and/or fans 1002. For example, baffles 1001 and/or fans 1002 may be used to control the return of heated air from cabinets in rows 14 and 16 to air conditioning unit 40 and heated air cabinets in rows 10 and 12 to air conditioning unit 42. In the event of a malfunction, such as a failure in air conditioning unit 40, baffles and/or fans may be used to control the return of heated air from cabinets in rows 14 and 16 to air conditioning unit 42. For example, if air conditioning unit 40 fails, baffles 1001 may be closed to shut off the passage leading to air conditioning unit 42, and fans 1002 may be turned on to draw air through the ducts towards air conditioning unit 42. Note that the configuration of air conditioning units and ductwork is not limited to the "Y" configuration shown in FIG. 10, and that alternate configurations, such as a "star" configuration, are contemplated and within the scope of the invention.

Figure 14:
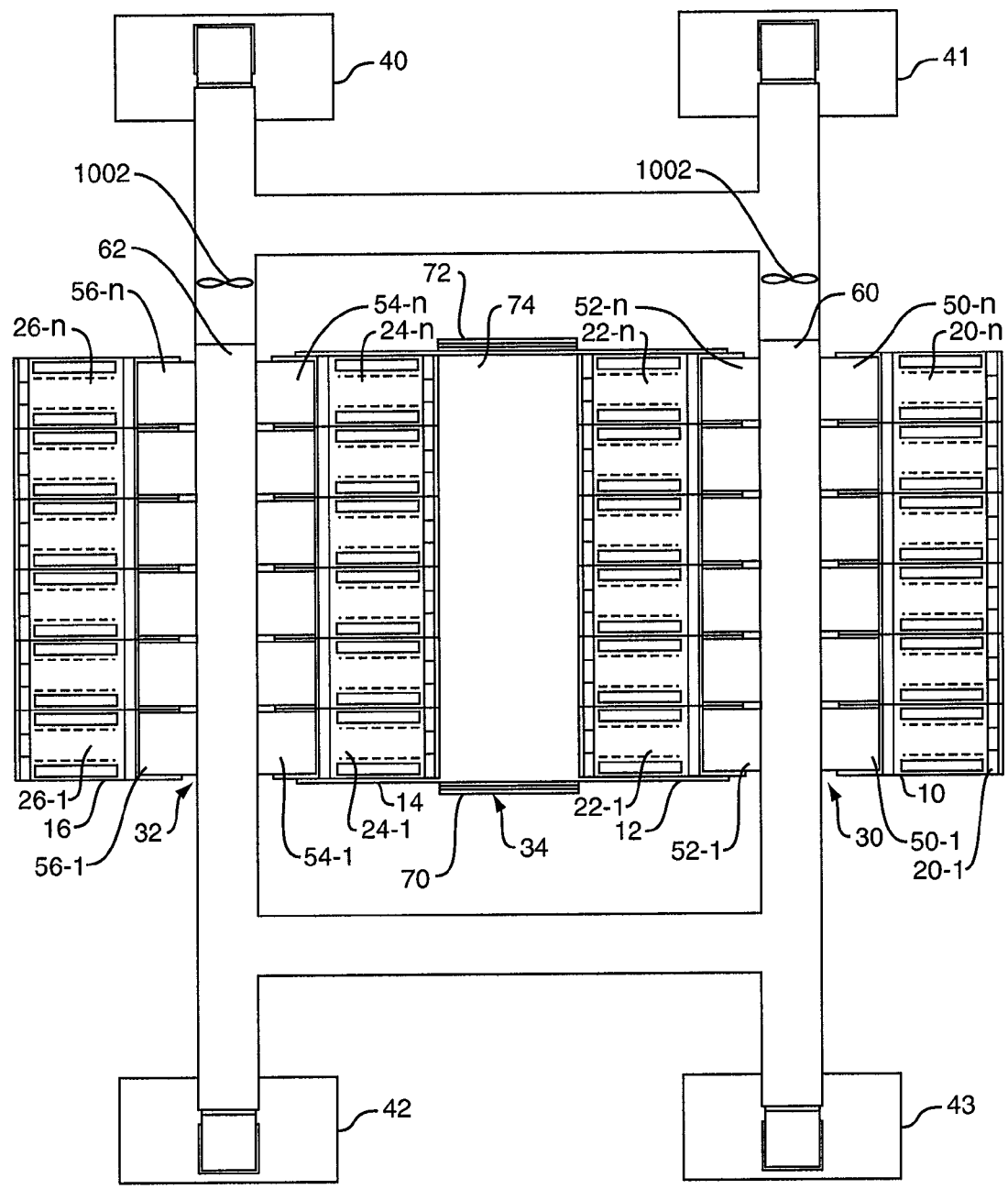
FIG. 14 is a top representation of a data center utilizing a closed loop heat containment and cold aisle system according to a preferred embodiment of the invention, in which the air conditioning units are redundant, and each air conditioning unit is configured to selectively service one or more rows of cabinets through the use of baffles and/or fans.

In alternate embodiments, and as shown in FIG. 14, one or more of the air conditioning units 40 and 42 may each have a redundant backup air conditioning unit, such as units 41 and 43. As with the embodiment shown in FIG. 13, each air conditioning unit 40, 41, 42 and 43 may be configured to selectively service one or more rows of cabinets through the use of baffles 1001 and/or fans 1002.

Figure 15:
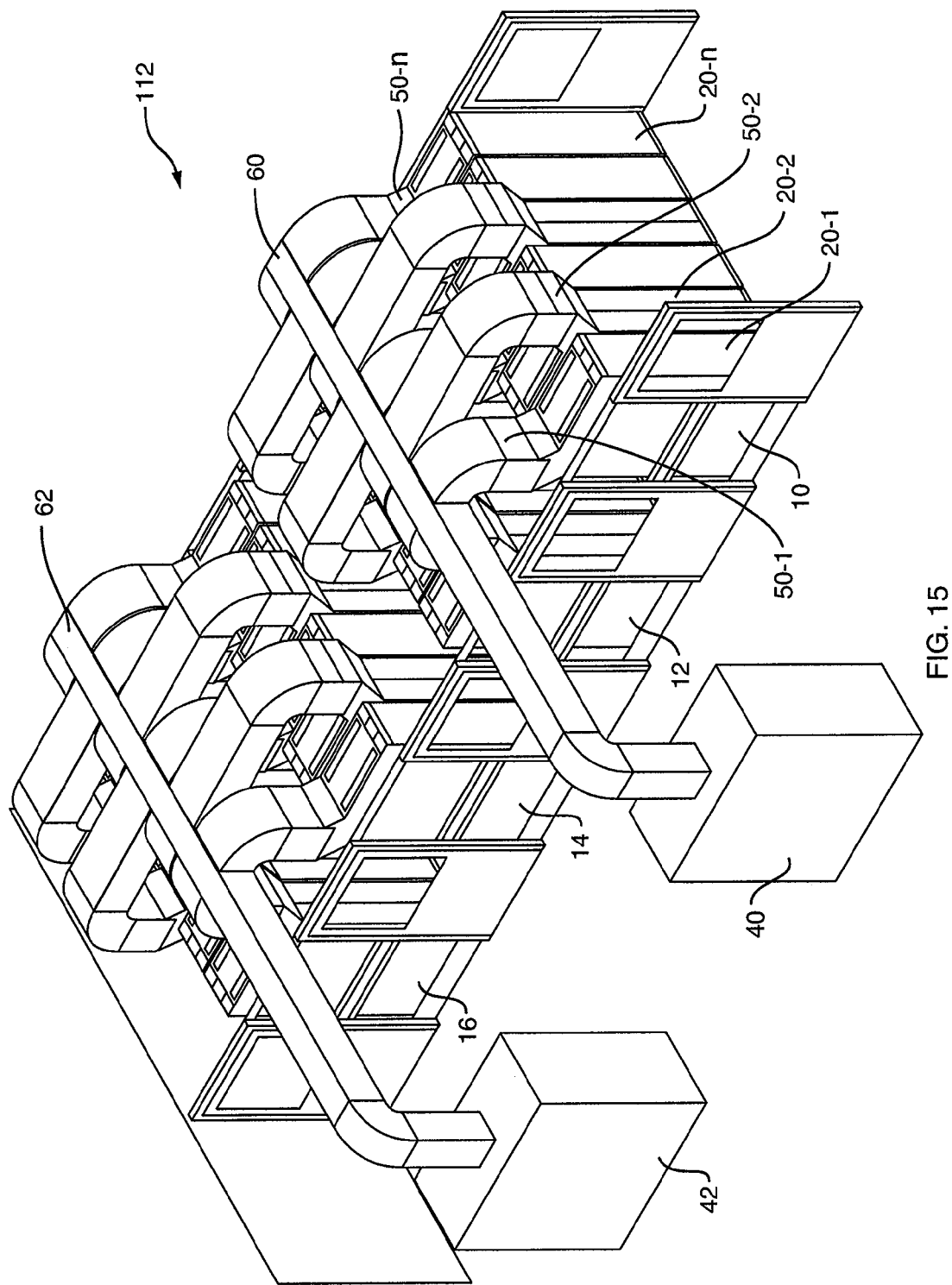
FIG. 15 is a perspective representation of a data center according to an alternate embodiment of the invention, in which the cabinets are not arranged to form hot aisles and cold aisles, and warmed air from the cabinets is exhausted into a below-ceiling duct.

FIG. 15 is a perspective representation of a data center 112 according to an alternate embodiment of the invention, in which the cabinets are not arranged to form hot aisles and cold aisles, and warmed air from the cabinets is exhausted into a below-ceiling duct.

As shown in FIG. 15, data center 112 is similar to the data center 100 shown in FIG. 4, with one or more rows 10, 12, 14 and 16 of cabinets and one or more air conditioning units 40 and 42. Unlike FIG. 4, though, the rows of cabinets 10, 12, 14 and 16 are arranged in an alternating pattern, such that the front panel or door of cabinet 20-1 is adjacent to the rear panel or door of cabinet 20-2. As further shown in FIG. 15, and as described previously with reference to FIGS. 4 through 6 and 7A through 7F, heated air within each cabinet is contained and directed through the chimneys 50-1, 50-2 . . . 50-n connected to the top, rear, or top and rear of the cabinets 20-1, 20-2 . . . 20-n. The heated air is returned to the air conditioning units 40 and 42 through ducts 60 and 62, respectively, which are located below the ceiling and coupled to the chimneys.

Figure 16:
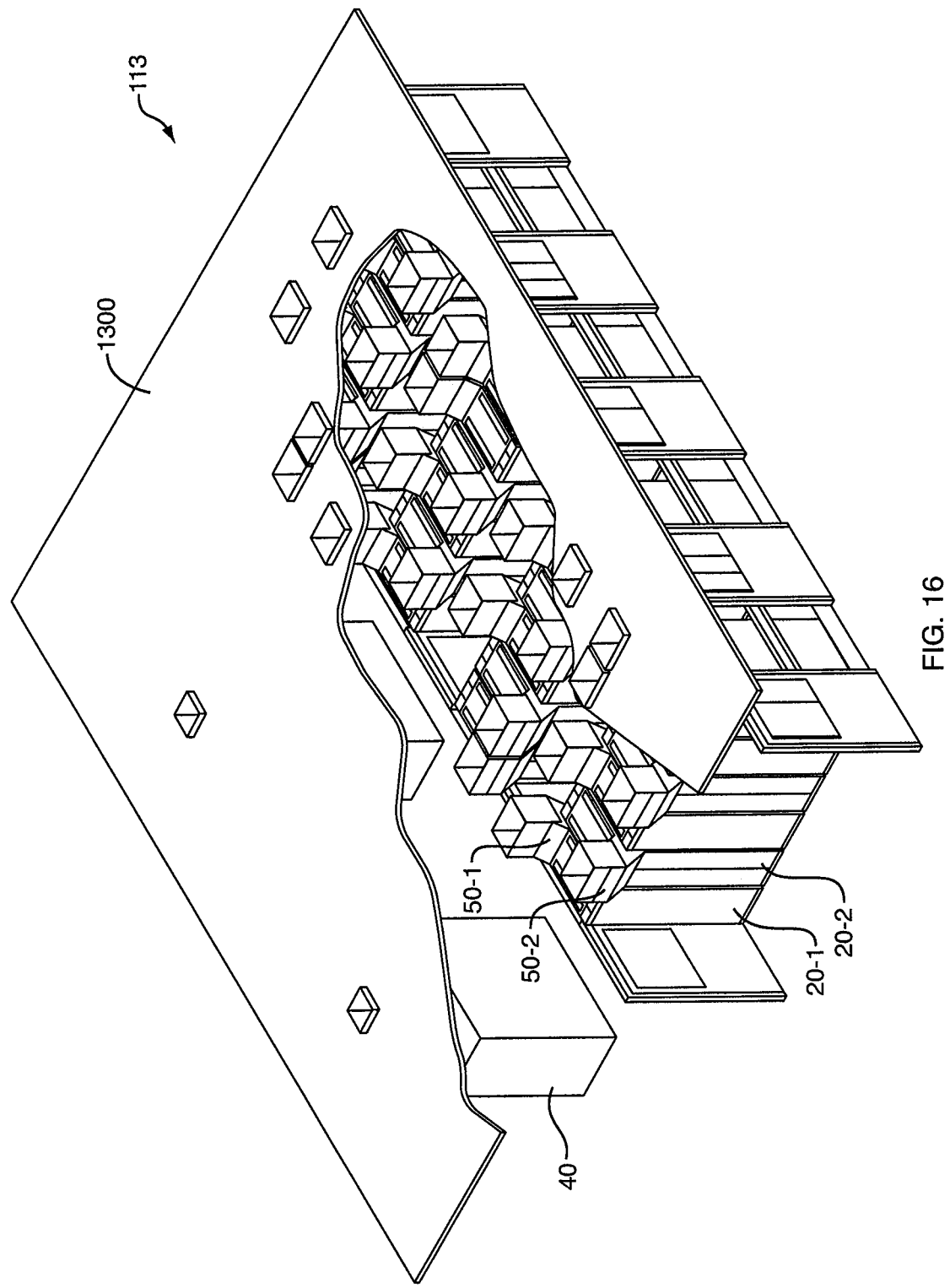
FIG. 16 is a perspective representation of a data center according to an alternate embodiment of the invention, in which the cabinets are not arranged to form hot aisles and cold aisles, and warmed air from the cabinets is exhausted into a pressurized ceiling plenum or suspended ceiling.

FIG. 16 is a perspective representation of a data center 113 according to an alternate embodiment of the invention, in which the cabinets are arranged as described above for FIG. 15. As shown in FIG. 16, however, warmed air from the cabinets is exhausted into a pressurized ceiling plenum or suspended ceiling 1300. Note that the arrangement of cabinets in FIGS. 15 and 16 is not limited to this particular embodiment, however, and other cabinet configurations are within the scope of the invention.

Figure 17:
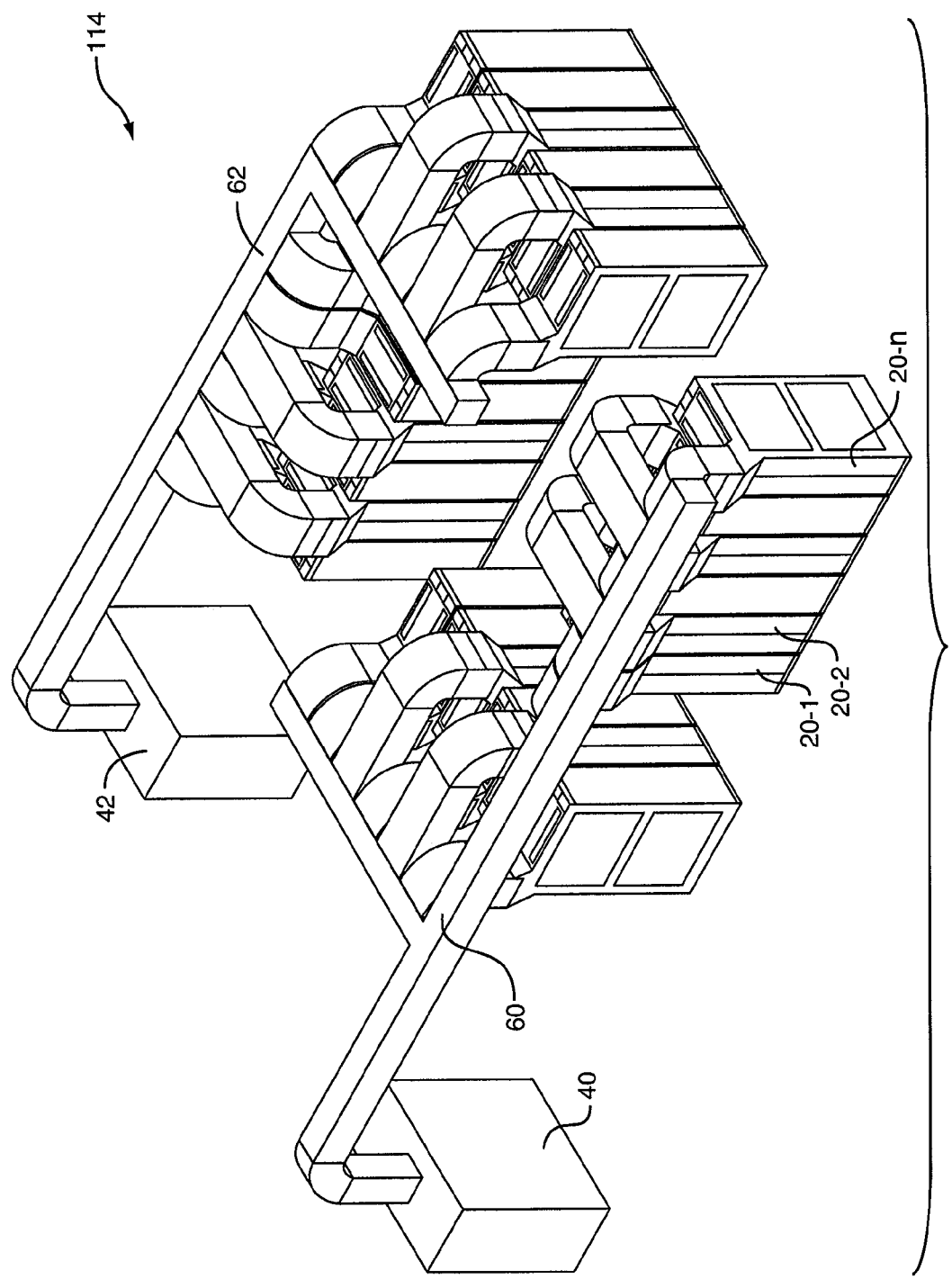
FIG. 17 is a perspective representation of a data center according to an alternate embodiment of the invention, in which the cabinets are not arranged to form hot and cold aisles, but are configured in a "chaos" layout, and warmed air from the cabinets is exhausted into a below-ceiling duct.
Figure 18:
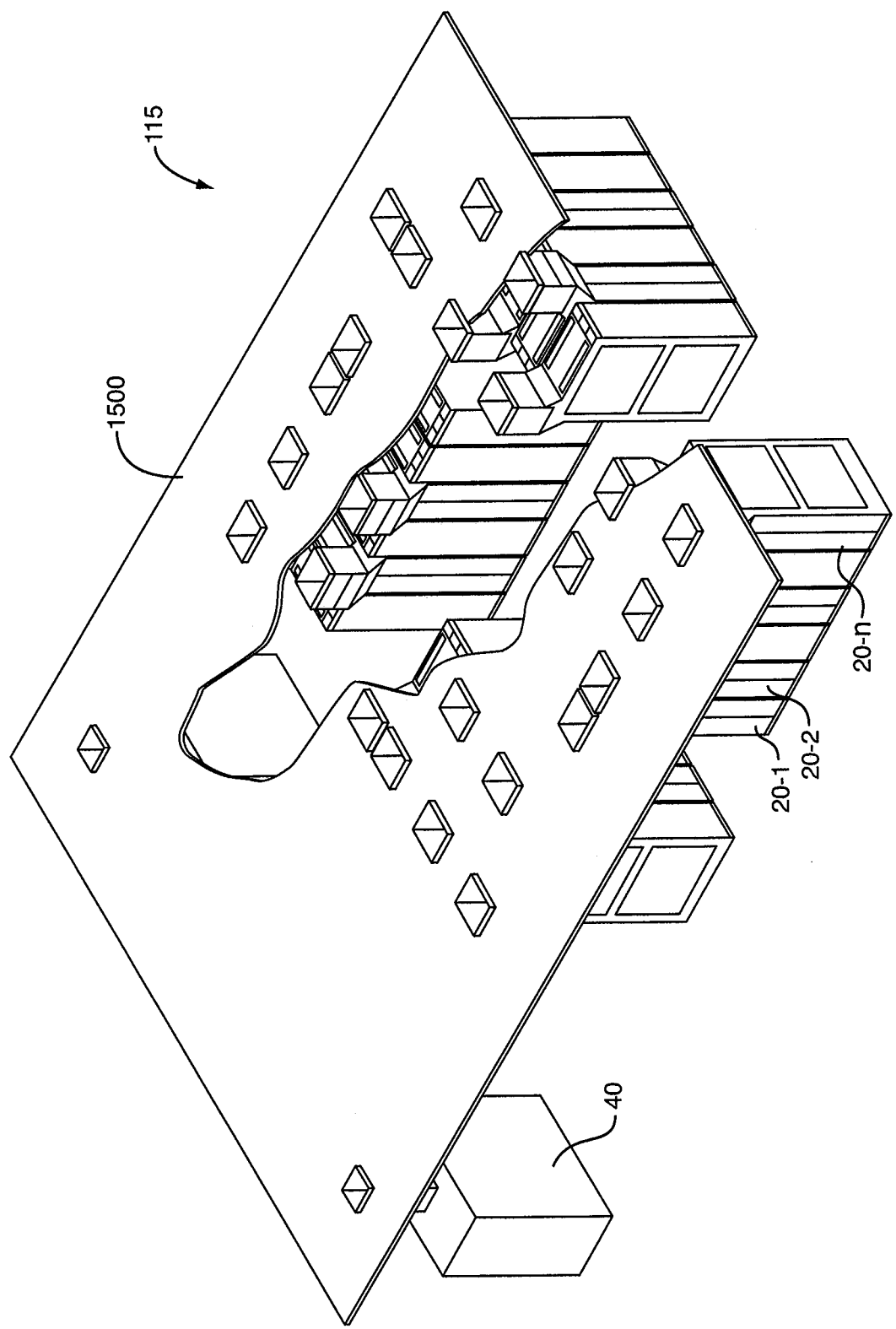
FIG. 18 is a perspective representation of a data center according to an alternate embodiment of the invention, in which the cabinets are not arranged to form hot and cold aisles, but are configured in a "chaos" layout, and warmed air from the cabinets is exhausted into a pressurized ceiling plenum or suspended ceiling.

FIG. 17 is a perspective representation of a data center 114 according to an alternate embodiment of the invention, in which the cabinets are not arranged to form hot and cold aisles, but are configured in a "chaos" layout, and warmed air from the cabinets is exhausted into a below-ceiling duct. FIG. 18 is a perspective representation of a data center 115 according to an alternate embodiment of the invention, in which the cabinets are arranged as described above for FIG. 17. As shown in FIG. 18, however, warmed air from the cabinets is exhausted into a pressurized ceiling plenum or suspended ceiling 1500. Note that the arrangement of cabinets in FIGS. 17 and 18 is not limited to this particular embodiment, however, and other cabinet configurations are within the scope of the invention.

Figure 19:
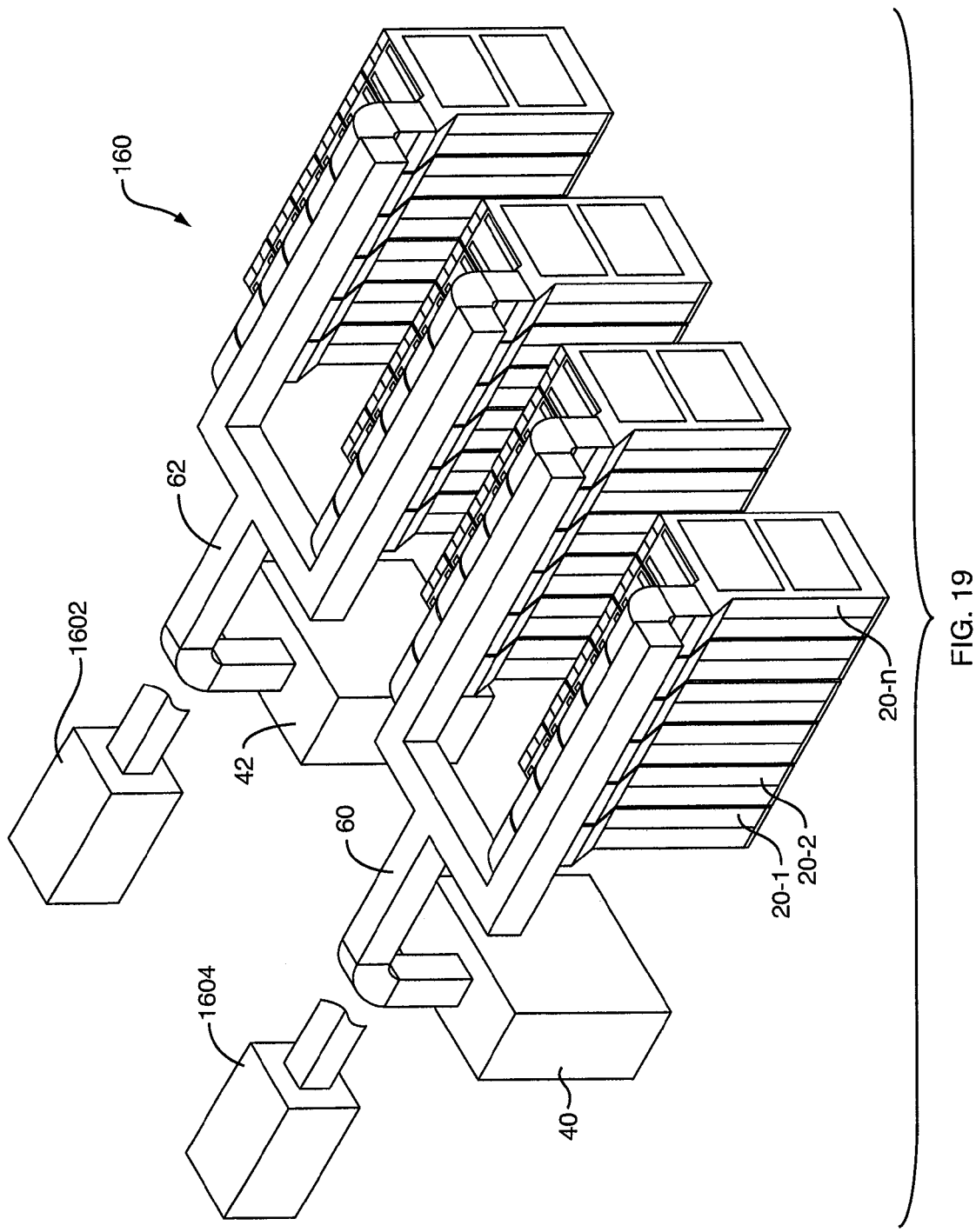
FIG. 19 is a perspective representation of a data center according to an alternate embodiment of the invention, in which the heated air is aggregated, and an air-side economizer is used to cool the heated air with cool outside air.

FIG. 19 is a perspective representation of a data center 160 according to an alternate embodiment of the invention, in which the heated air is aggregated, and one or more air-side economizers 1602 and 1604 may be used to cool the heated air with cool outside air. In this configuration, baffles and/or fans (not shown) may be used to control the return of heated air in ducts 60 and 62 to air conditioning units 40 and 42, in addition to, or instead of, air-side economizers 1602 and 1604.

In alternate embodiments, locations and equipment in the data center may be instrumented to monitor and control temperature, air pressure, power consumption, efficiency, and overall availability, using systems and methods known in the art.

The claims should not be read as limited to the described order or elements unless stated to that effect. Therefore, all embodiments that come within the scope and spirit of the following claims and equivalents thereto are claimed as the invention.

It should be understood that the embodiments described herein are exemplary and do not limit the scope of the invention, and that various modifications could be made by those skilled in the art that would fall under the scope of the invention. The scope of the invention is set forth in the claims.

What is claimed is:

1. A system for use in a data center having a source of cool air, the system comprising:
   a first set of cabinets, each cabinet of the first set of cabinets comprising a generally rectangular vertical front face, two generally rectangular vertical side faces coupled to the front face, a generally rectangular top face coupled to the side faces and to the front face, a generally rectangular back face coupled to the side faces, and an interior that is adapted to house one or more heat-generating components, each of the cabinets adapted to intake the cool air, wherein the first set of cabinets are arranged in a first row and a second row horizontally displaced from each other such that the front faces of the cabinets in the first row are facing the front faces of the cabinets in the second row to define a cold aisle between the front faces;
   a first baffle proximate the front face of a first cabinet in the first row and the front face of a first cabinet in the second row, the first baffle being configured to inhibit horizontal airflow into and out of the cold aisle;
   a second baffle proximate the front face of a last cabinet in the first row and the front face of a last cabinet in the second row, the second baffle being configured to inhibit horizontal airflow into and out of the cold aisle;
   at least one chimney in communication with at least one cabinet of the first set of cabinets in the first row, the at least one chimney configured to conduct air warmed by the heat-generating components to a location above the cabinets;
   at least one chimney in communication with at least one cabinet of the first set of cabinets in the second row, the at least one chimney configured to conduct air warmed by the heat-generating components to a location above the cabinets;
   wherein the at least one chimney in communication with at least one cabinet of the first set of cabinets in the first row is carried by the top and back faces of the at least one cabinet of the first set of cabinets in the first row; and
   wherein the at least one chimney in communication with at least one cabinet of the first set of cabinets in the second row is carried by the top and back faces of the at least one cabinet of the first set of cabinets in the second row;
   a first duct in communication with the at least one chimney of the first set of cabinets in the first row, the first duct configured to conduct air warmed by the heat-generating components from the location above the cabinets to an air conditioning unit;
   the air conditioning unit being configured to supply the cool air to the data center;
   a second set of cabinets, each cabinet of the second set of cabinets comprising a generally rectangular vertical front face, two generally rectangular vertical side faces coupled to the front face, a generally rectangular top face coupled to the side faces and to the front face, a generally rectangular back face coupled to the side faces, and an interior that is adapted to house one or more heat-generating components, each cabinet of the second set of cabinets adapted to intake the cool air, the second set of cabinets are arranged in a third row horizontally displaced from the first row formed by the first set of cabinets such that the back faces of the cabinets in the third row are facing the back faces of the cabinets in the first row to define a first hot aisle between the back faces;
   a third set of cabinets, each cabinet of the third set of cabinets comprising a generally rectangular vertical front face, two generally rectangular vertical side faces coupled to the front face, a generally rectangular top face coupled to the side faces and to the front face, a generally rectangular back face coupled to the side faces, and an interior that is adapted to house one or more heat-generating components, each cabinet of the third set of cabinets adapted to intake the cool air, the third set of cabinets are arranged in a fourth row horizontally displaced from the second row formed by the first set of cabinets such that the back faces of the cabinets in the fourth row are facing the back faces of the cabinets in the second row to define a second hot aisle between the back faces;
   at least one chimney in communication with at least one cabinet of the second set of cabinets in the third row, for conducting air warmed by the heat-generating components to a location above the cabinets; and
   at least one chimney in communication with at least one cabinet of the third set of cabinets in the fourth row, for conducting air warmed by the heat-generating components to a location above the cabinets.

2. The system of claim 1, where the chimney defines an air passageway that is in fluid communication with the interior of the cabinet, the air passageway comprising an inlet for taking in air leaving the cabinet and an outlet for conducting the air out of the air passageway to the location above the cabinets.

3. The system of claim 1, where the top face of each cabinet defines a first opening leading to the rack interior, the first opening located at the back of the top face, proximate the back face;

where the back face of each cabinet defines a second opening leading to the cabinet interior, the second opening located at the top of the back face, proximate the top face; and where the chimney defines an air passageway that encompasses and is in fluid communication with the first and second openings, the air passageway comprising an inlet for taking in air leaving the cabinet, and an outlet for conducting the air out of the air passageway to the location above the cabinets.

4. The system of claim 1, where the chimney includes a fan.

5. The system of claim 1, where the chimney is in communication with the top face of the cabinet.

6. The system of claim 1, where the cool air is delivered to the cold aisle through a plurality of perforations in a floor of the data center.

7. The system of claim 1, where the cool air is delivered to the data center through the bottoms of the cabinets.

8. The system of claim 1, where the cool air is delivered directly into the cold aisle through one or more ducts.

9. The system of claim 1, further comprising at least one duct in communication with the chimney, is configured to conduct air warmed by the heat-generating components to a suspended ceiling.

10. The system of claim 9, where the duct comprises a fan or baffle.

11. The system of claim 9, where the duct comprises a fan or baffle.

12. The system of claim 1, further comprising at least one duct in communication with the chimney, is configured to conduct air warmed by the heat-generating components directly to an intake of at least one of the air conditioning units.

13. The system of claim 1, where at least one of the first baffle or the second baffle comprises a door.

14. The system of claim 1, where at least one of the baffles comprises a window.

15. The system of claim 1, further comprising a cover joining the first row of cabinets and the second row of cabinets, the cover being configured to inhibit vertical airflow into and out of the cold aisle.

16. The system of claim 15, where the cover includes a translucent panel.

17. The system of claim 1, wherein:

the at least one chimney in communication with at least one cabinet of the second set of cabinets in the third row is carried by the top and back faces of the at least one cabinet of the second set of cabinets in the third row; and wherein the at least one chimney in communication with at least one cabinet of the third set of cabinets in the fourth row is carried by the top and back faces of the at least one cabinet of the third set of cabinets in the fourth row.

18. The system of claim 17, comprising:

the first duct in communication with the at least one chimney of the second set of cabinets in the third row, the first duct configured to conduct air warmed by the heat-generating components from the location above the cabinets to the air conditioning unit; and a second duct in communication with the at least one chimney of the first set of cabinets in the second row and with the at least one chimney of the third set of cabinets in the fourth row, the second duct configured to conduct air warmed by the heat-generating components from the location above the cabinets to the air conditioning unit.

* * * * *